United States Patent
Suh et al.

(10) Patent No.: US 11,489,610 B2
(45) Date of Patent: *Nov. 1, 2022

(54) WAVEFORM-CODING FOR MULTICARRIER WAKE UP RADIO FRAME

(71) Applicant: Huawei Technologies Co., Ltd., Shenzhen (CN)

(72) Inventors: Jung Hoon Suh, Ottawa (CA); Osama Aboul-Magd, Ottawa (CA); Kwok Shum Au, Ottawa (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 76 days.

This patent is subject to a terminal disclaimer.

(21) Appl. No.: 16/825,505

(22) Filed: Mar. 20, 2020

(65) Prior Publication Data
US 2020/0220641 A1 Jul. 9, 2020

Related U.S. Application Data

(63) Continuation of application No. 15/654,250, filed on Jul. 19, 2017, now Pat. No. 10,644,820.
(Continued)

(51) Int. Cl.
*H04J 13/12* (2011.01)
*H04L 27/04* (2006.01)
(Continued)

(52) U.S. Cl.
CPC ............ *H04J 13/12* (2013.01); *H03M 1/127* (2013.01); *H04J 13/004* (2013.01); *H04L 27/04* (2013.01);
(Continued)

(58) Field of Classification Search
CPC ......... H04J 13/12; H04J 13/004; H03M 1/127
See application file for complete search history.

(56) References Cited

U.S. PATENT DOCUMENTS 9,485,733 B1   11/2016  Park et al.
10,129,064 B1* 11/2018  Lee .................... H04L 27/2618
(Continued)

FOREIGN PATENT DOCUMENTS

CN   102638437 A   8/2012
CN   102783110 A   11/2012
(Continued)

OTHER PUBLICATIONS

Eunsung Park (LG Electronics): "Further Investigation on WUR Performanc", 11-16-1144-00-0wur-further-investigation-on-wur-performance, IEEE802.11-16/1144r0, Sep. 2016, total 13 pages. XP068107537.
(Continued)

*Primary Examiner* — Zhiren Qin

(57) ABSTRACT

Waveform-coding is applied to map successive on-off-keying (OOK) data bits onto successive multicarrier modulated symbols in time domain, wherein each multicarrier modulated symbol includes a set of sub-carriers in which alternating sub-carriers are set to non-zeros and zeros in frequency domain. The waveform coded multicarrier modulated symbols are up-converted to a carrier frequency to provide a data signal that is transmitted over a wireless channel.

20 Claims, 18 Drawing Sheets

Related U.S. Application Data

(60) Provisional application No. 62/455,365, filed on Feb. 6, 2017.

(51) Int. Cl.

| | | |
|---|---|---|
| *H04L 27/26* | (2006.01) | |
| *H03M 1/12* | (2006.01) | |
| *H04J 13/00* | (2011.01) | |
| *H04L 27/06* | (2006.01) | |
| *H04L 25/49* | (2006.01) | |

(52) U.S. Cl.
CPC .......... *H04L 27/06* (2013.01); *H04L 27/2627* (2013.01); *H04B 2201/709709* (2013.01); *H04L 25/4904* (2013.01)

(56) References Cited

U.S. PATENT DOCUMENTS

| | | | | |
|---|---|---|---|---|
| 2013/0208917 A1* | 8/2013 | Fielder | ...................... | H04R 3/04 381/103 |
| 2013/0236194 A1* | 9/2013 | Saunders | ............... | H04B 10/70 398/163 |
| 2015/0362528 A1* | 12/2015 | Pu | ...................... | G01R 19/2509 324/127 |
| 2016/0021652 A1 | 1/2016 | Han et al. | | |
| 2016/0374022 A1 | 12/2016 | Ang et al. | | |
| 2018/0091344 A1 | 3/2018 | Azizi et al. | | |
| 2018/0152333 A1* | 5/2018 | Shellhammer | .......... | H04L 27/30 |
| 2019/0260624 A1* | 8/2019 | Park | ........................ | H04L 27/04 |
| 2020/0092811 A1* | 3/2020 | Park | ........................ | H04L 27/04 |
| 2020/0100182 A1* | 3/2020 | Yun | .................... | H04W 52/0235 |
| 2020/0127756 A1* | 4/2020 | Iwai | .................... | H04L 27/2634 |

FOREIGN PATENT DOCUMENTS

| | | |
|---|---|---|
| CN | 104735017 A | 6/2015 |
| CN | 105024754 A | 11/2015 |
| JP | 2003143087 A | 5/2003 |
| JP | 2013108917 A | 6/2013 |
| WO | 2016209726 A1 | 12/2016 |

OTHER PUBLICATIONS

Eunsung Park (LG Electronics): "PerformanceInvestigationon Wake-Up Receiver 11-16-0865-01-0wur-performance-investigation-on-wakeup-receiver", IEEE802.11-16/0865r1, Jul. 2016, total 16 pages. XP068107134.

Leif Wilhelmsson (Ericsson): "Discussion of a Wake-Up Receiver Front-End Model; 11-17-0093-01-00ba-discussion-of-a-wake-up-receiver-front-end-model", IEEE802.11-17/0093r1, Jan. 2017, pp. 1-23, XP068112522.

\* cited by examiner

WAVEFORM-CODING FOR MULTICARRIER WAKE UP RADIO FRAME

RELATED APPLICATION

This application is a continuation of U.S. patent application Ser. No. 15/654,250 filed Jul. 19, 2017, and claims priority to and the benefit of U.S. Provisional Patent Application No. 62/455,365 filed Feb. 6, 2017, the contents of which are incorporated by reference.

FIELD

The present application relates to methods and systems for communicating using a low data rate such as with a Wake Up Radio.

BACKGROUND

In wireless communication, efficient use of the available power is one of the main goals of system design. Often, a wireless local area network (WLAN) device, such as in Internet of Things (IoT) applications, relies on a limited power supply (e.g., as supplied by rechargeable or non-rechargeable batteries). Examples of such a device may include sensor devices located in remote fields measuring some physical phenomenon, e.g., water level or temperature; and wearable devices measuring some bodily function, e.g., pulse rate.

Such a device may be designed to operate on a low duty cycle (e.g., communicating with an access point (AP) only once per day) and thus it may not be appropriate for its WLAN receiver circuit to be always on. The limited power supply (e.g., battery) of the device may be quickly exhausted if not provided with an appropriate sleep mode for the WLAN receiver circuit and an appropriate wake-up mechanism. The wake-up mechanism may require communication of wake-up signals between an AP and a device.

SUMMARY

Low data rate receiver systems, including Wake Up Radios (WURs), are limited by power consumption. Thus, there is a need for a transmitted wake up signal that can be detected by a WUR using a simple detection algorithm.

According to a first aspect is a method of providing a data signal. The method includes waveform-coding successive on-off-keying (OOK) mapped data bits onto successive multicarrier modulated symbols in time domain, wherein each multicarrier modulated symbol includes a set of sub-carriers in which alternating sub-carriers are set to non-zeros and zeros in frequency domain. The waveform coded multicarrier modulated symbols are up-converted to a carrier frequency to provide a data signal that is transmitted over a wireless channel.

In some examples, each multicarrier modulated symbol includes a total of N sub-carriers that are available, and the set of sub-carriers include M consecutive sub-carriers that are in the middle of N sub-carriers to be used, the M subcarriers are set between non-zeros and zeros alternately, where N>M. In some examples, the sub-carriers of each multicarrier modulated symbol are orthogonal sub-carriers. In some examples, N=64, M=13. In some examples, 7 of the M subcarriers are set to non-zeros and the alternating remaining of the M subcarriers are set to zeros.

In any of the preceding aspects/examples, the N sub-carriers are generated periodically by using an N point Inverse Fast Fourier Transform (IFFT).

In any of the preceding aspects/examples, the bandwidth (BW) of the M consecutive sub-carriers is 4.1 MHz.

In any of the preceding aspects/examples, the M consecutive sub-carriers may have a duration of 3.2 microsecond (us).

In any of the preceding aspects/examples, each multicarrier modulated symbol may include a guard interval prepended in time domain.

In any of the preceding aspects/examples, the sub-carriers may have an inter-carrier spacing (SS) of 312.5 kHz, and each multicarrier modulated symbol may have a duration of 4 us including the guard interval.

In any of the preceding aspects/examples, the sub-carriers are sampled at a sampling rate equal to 20 MHz.

Any of the preceding aspects/examples can include storing a waveform of a time domain sample multicarrier modulated symbol including a prepended guard interval in a memory. Each of the successive multicarrier modulated symbols comprises a copy of the waveform.

In any of the preceding aspects/examples, the waveform-coding comprises Manchester-coding the successive data bits onto the successive multicarrier modulated symbols.

In some examples each multicarrier modulated symbol has a duration of 4 us including a prepended guard interval duration of 0.8 us, and each Manchester-coded symbol represents a binary 1 as one of, and a binary 0 as the other of: (i) a leading 2 us duration having a higher energy level than a trailing 2 us duration, and (ii) a leading 2 us duration having a lower energy level than a trailing 2 us duration.

According to a further aspect is a device for transmitting a data signal. The device includes a memory storing instructions, one or more processor coupled to the memory and configured to execute the instructions to: waveform code successive on-off-keying (OOK) mapped data bits onto successive multicarrier modulated symbols in time domain, wherein each multicarrier modulated symbol includes a set of sub-carriers in which alternating sub-carriers are set to non-zeros and zeros in frequency domain, up-convert the waveform coded multicarrier modulated symbols to a carrier frequency to provide a data signal; and transmit the data signal over a wireless channel.

In any of the preceding aspects/examples, each multicarrier modulated symbol includes a total of N sub-carriers that are available, and the set of sub-carriers includes M consecutive sub-carriers that are in the middle of N sub-carriers to be used, the M subcarriers are set between non-zero and zero alternately, where N>M.

In any of the preceding aspects/examples, sub-carriers of each multicarrier modulated symbol are orthogonal sub-carriers.

In any of the preceding aspects/examples, N=64 and M=13.

In any of the preceding aspects/examples, the memory further stores a waveform of a time domain sample multicarrier modulated symbol including a prepended guard interval in a memory, wherein each of the successive multicarrier modulated symbols comprises a copy of the waveform. In any of the preceding aspects/examples, the one or more processors further configured to execute the instructions to generate the N sub-carriers periodically by using an N point Inverse Fast Fourier Transform (IFFT).

In any of the preceding aspects/examples, 7 of the M subcarriers are set to non-zeros and the alternating remaining of the M subcarriers are set to zeros.

According to an example aspect are a method and apparatus for providing a wake-up signal. Successive OOK mapped data bits of a wake-up packet are Manchester-coded onto successive identical OFDM symbols in the time domain, wherein each OFDM symbol includes a set of sub-carriers in which alternating sub-carriers are set to non-zeros and zeros in frequency domain. The coded symbols are upconverted to a carrier frequency to provide a wake-up signal for transmission over a wireless channel. Also provided is a receiver configured to receive such a wake-up. The receiver is configured to determine power distribution in received symbols contained within the wake-up signal and determine if the received symbols correspond to zeros or non-zero based thereon. In some examples an access point is provided to perform the above method and a receiver station is provided to decode the wake-up signal.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DETAILED DESCRIPTION

A user device or station such as a machine type device or sensor device that is intended to operate in a wireless network such as a wireless local area network (WLAN) may have a separate low-power Wake Up Radio (WUR) circuit in addition to a higher power WLAN transceiver circuit. A WUR circuit is generally a low-power receiver circuit designed for receiving and detecting a wake-up signal, and may in some examples be a simplified version of the main WLAN transceiver circuit and may be implemented on integrated circuit (IC) or chip. The WUR circuit communicates with the WLAN transceiver circuit, or other equivalent circuit, of the device, so the WLAN transceiver circuit may sleep and conserve power until the WUR circuit wakes up the WLAN transceiver circuit. The WUR circuit wakes up the WLAN transceiver circuit, or other equivalent circuit, when the WUR circuit detects a wake-up signal from an access point AP (typically, an AP associated with the WLAN device).

Figure 1:
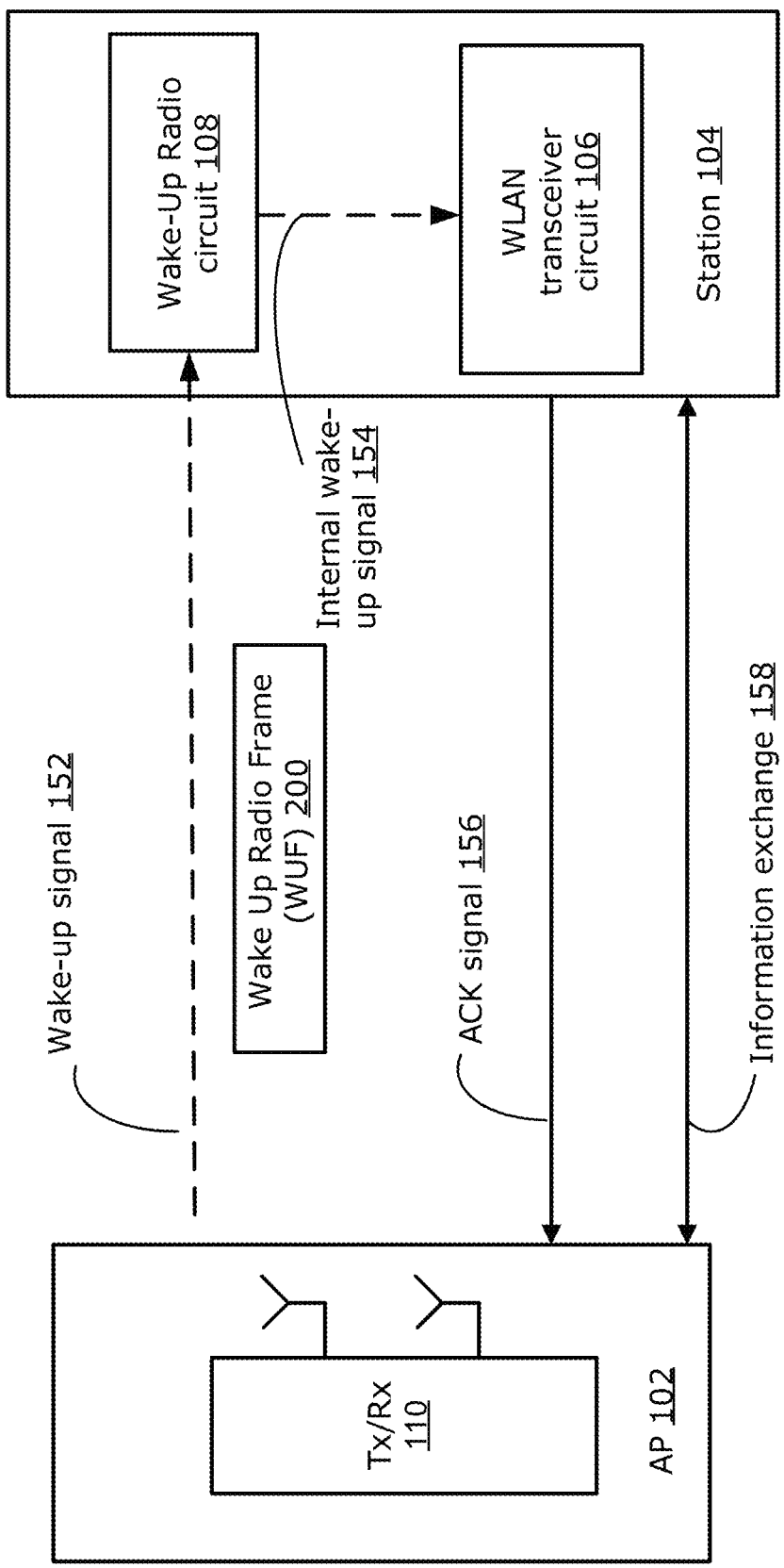
FIG. 1 is a block diagram illustrating communications between an AP and an example station having a Wake Up Radio circuit.

In this regard, FIG. 1 is a schematic diagram illustrating an example AP 102 and an example station 104 (e.g., a low duty cycle WLAN device or other wireless device) associated with the AP 102. The example station 104 includes a WLAN transceiver circuit 106 (e.g., a Wi-Fi transceiver) and a WUR circuit 108 (also referred to simply as WUR 108). The AP 102 includes WLAN transceiver circuit 110. In example embodiments, the WUR 108 is a simple low power receiver that does not have a transmitter and functions to wake up the WLAN transceiver circuit 106 when needed.

FIG. 1 illustrates a set of example signals that may be communicated for waking up a sleeping WLAN receiver circuit 106. The AP 102 may send a wake-up signal 152, carrying a Wake-Up-Frame (WUF) 200 (described further below) to the station 104. The WUF 200 is detected by the WUR circuit 108, and the WUR circuit 108 sends an internal wake-up signal 154 to the WLAN receiver circuit 106, waking up the WLAN transceiver circuit 106 if the WLAN receiver circuit 106 is in sleep mode. The WLAN transceiver circuit 106 then sends an ACK signal 156 back to the AP 102. Appropriate information exchange 158 between the AP 102 and the station 104 (via the WLAN transceiver circuit 106) may then take place. After the information exchange 158 is finished, the WLAN transceiver circuit 106 may return to the sleep state.

Although FIG. 1 shows wakeup signal 152 being communicated to a WUR circuit 108 that is associated with a WLAN transceiver circuit 106, the processes and systems described in the present disclosure may be applicable to other circuits, including other wireless receiver circuits, which may benefit from a wake-up mechanism. In an example embodiment, the wake-up signal 152 is communicated using multicarrier modulation.

Wake up Radio Frame with OFDM Based OOK Data

In some applications, the use of OFDM for wake-up signal 152 may allow a shorter frame length to be used as compared to a single carrier based modulation. Additionally, OFDM may simplify equalization of a fading channel. Furthermore, using a similar OFDM technology for both the WUF 200 and other WLAN communications may help reduce implementation costs by allowing reuse of pre-existing WLAN implementation on the station 104.

Figure 2:
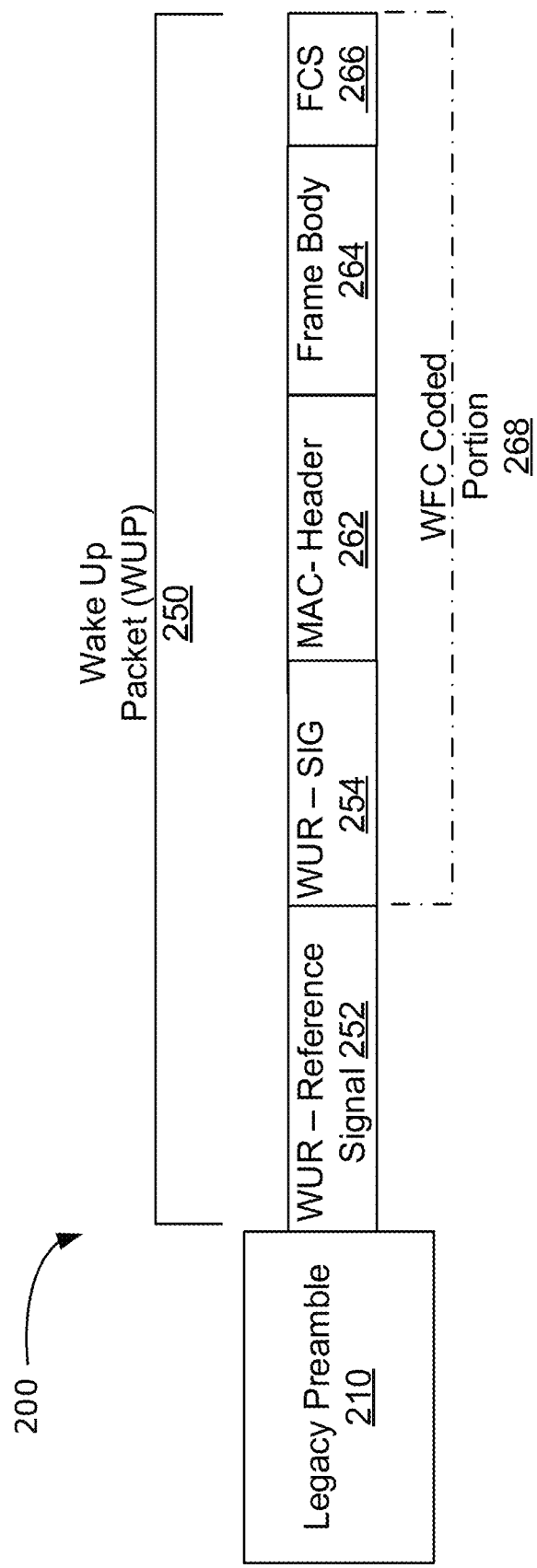
FIG. 2 illustrates a frame format for an example wake-up frame.

An example frame format for an example WUF 200 is shown in FIG. 2. The heights of the various blocks shown in FIG. 2 illustrate the relative bandwidths (BWs) of each portion. In the example of FIG. 2, the WUF 200 includes a legacy preamble 210 pre-pended to a wake-up portion or packet (WUP) 250. The WUP 250 includes a WUR—Reference Signal field 252, a WUR signal (SIG) field 254, a MAC header 262, a frame body 264 and a frame check sequence (FCS) 266. In an example embodiment the WUR-Reference Signal field 252 may include a Wakeup preamble, for example a pseudo noise (PN) sequence, and the MAC header 262 may include a receiver address. The MAC header 262, frame body 264 and FCS 266 may together be referred to as the payload of the WUR portion 250.

The legacy preamble 210 serves to silence all non-destination WLAN devices during the transmission of the WUF 200. The legacy preamble 210 may include a legacy short training field (L-STF), a legacy long training field (L-LTF), and a legacy signal (L-SIG) field. The legacy preamble 210 is generally 20 MHz wide in BW, in accordance with legacy standards. In the example of FIG. 2, the WUP 250 is illustrated as being narrower in BW than the legacy preamble 210, for example the WUP 250 may be 5 MHz in BW, although other BWs may also be suitable. The legacy preamble 210 is used for coexistence with other IEEE 802.11 devices, however in some examples the legacy preamble 210 may be omitted.

The WUR-Reference Signal 252 is provided for packet detection and synchronization. In some examples, WUR-Reference signal may include a short training field (STF) and a long training field (LTF) that can be used by the WUR 108 to detect the WUP 250 as distinct from other frames. In some examples, WUR 108 may not need any additional information beyond what is contained in the WUR-Reference Signal 252, enabling the wake-up-frame 200 to be short in length and thus requiring less power by the WUR 108 to process the wake-up-frame 200. However, in other embodiments the additional information contained in the further fields of WUP 250 may be required to enable a higher degree of functionality at WUR 108.

In example embodiments, OFDM based multi carrier modulation (MCM) is used for WUP 250, with the resulting waveform having a bandwidth less than 20 MHz. OFDM waveforms are typically defined by a set of numerology attributes including subcarrier or tone spacing (SS); number of subcarriers or tones (M); and cyclic prefix or guard interval length ($T_{GI}$). Different numerologies can be used in different embodiments. One example numerology set that may be used is: Total number of subcarriers M=16 (including one DC null subcarrier, leaving 15 available subcarriers); subcarrier spacing SS=312.5 kHz; $T_{GI}$=¼ of the useful symbol time period $T_u$; useful symbol time period $T_u$=3.2 μs; and total symbol period $T_{tot}$=4 μs. With M=16 and SS=312.5 kHz, the resulting signal bandwidth is 5 MHz. It will be recognized that this numerology is similar to that of the IEEE 802.11a standard, although with a reduced set of subcarriers, which can allow reuse of some circuit design aspects that have been established for 802.11a. The subcarriers are orthogonal because the inter subcarrier spacing SS is the inverse of the useful symbol length $T_u$.

Figure 3:
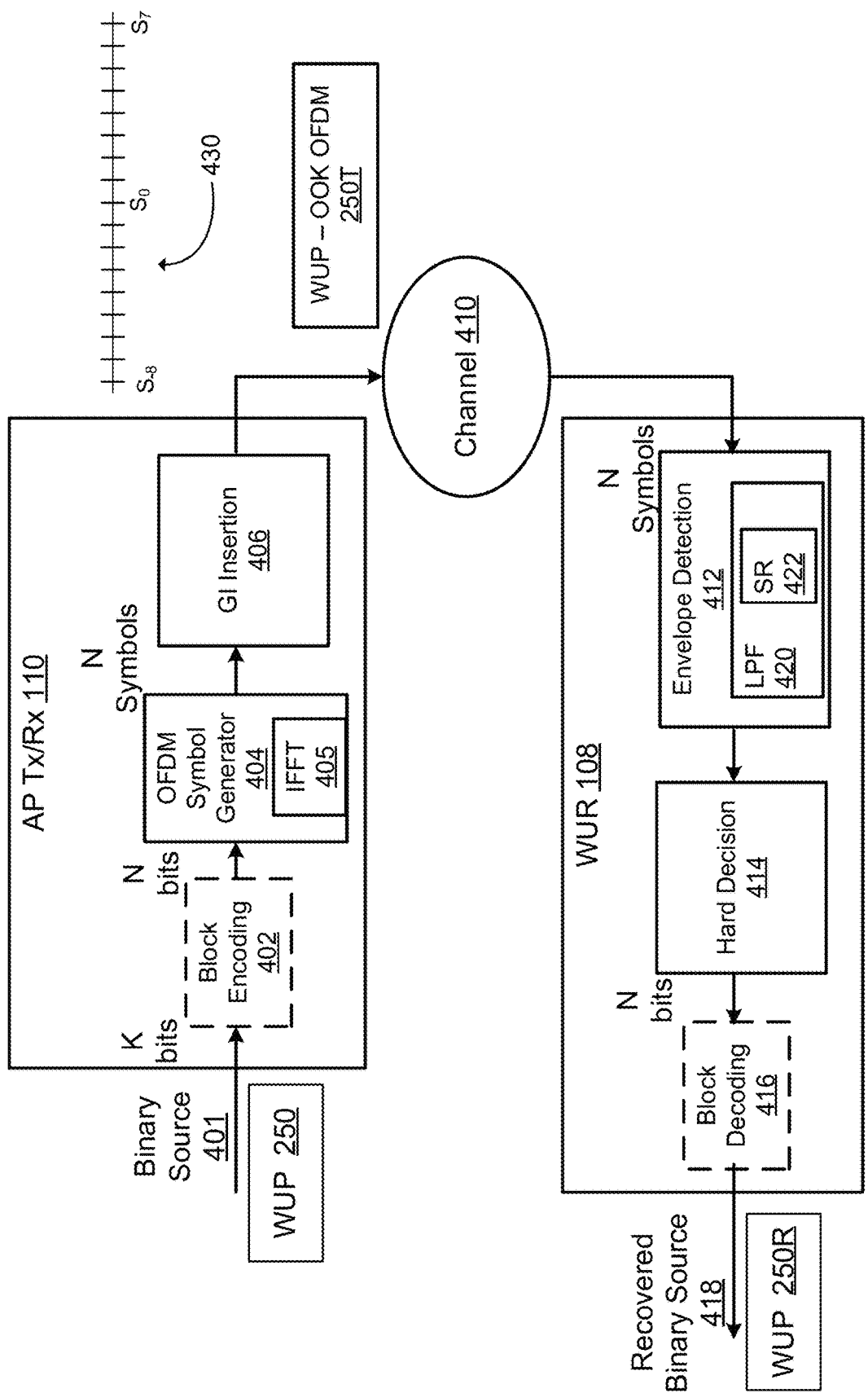
FIG. 3 is a block diagram illustrating an OFDM system.

In this regard, FIG. 3 is a basic system block diagram illustrating an OFDM based system. In particular, FIG. 3 shows the process flow applied at the AP transceiver 110 and the WUR circuit 108 to WUP 250. In some examples, each processing block 412, 414, 416 shown as being performed at WUR circuit 108 represents an operation that may be implemented as a module or element that is part of a common integrated circuit. Similarly, each processing block 402, 404, 406 shown as being performed at AP transceiver 110 represents an operation that may for example be implemented as a module or element of a common integrated circuit.

As shown in FIG. 3, WUP 250 is provided as a binary source 401 input to AP transceiver 110. In examples, binary source 401 input is mapped using on-off keying (OOK). In some examples, block encoding to apply error correction and/or compress data (e.g. encoding K bits to N-bit codewords) can be applied to the binary source 401 by a block encoding operation 402, however such encoding is optional.

An OFDM symbol generation operation 404 is then performed on the OOK mapped data bits to generate corresponding OFDM based symbols. In example embodiments, each data bit is represented by a single OFDM based symbol such that N data bits results in N successive symbols. Thus, for each symbol, the OFDM symbol generator 404 is used to modulate the same data bit across all of the orthogonal subcarriers of the corresponding OFDM symbol (represented by item 430 in FIG. 3). In an example using the numerology parameters set out above, OFDM symbol 430 includes M=16 subcarriers $S_{-8}$ to $S_7$, having subcarrier spacing SS=312.5 kHz, with one of the central subcarriers (for example $S_0$) used as a DC null tone and the remaining 15 subcarriers (for example $S_{-8}$ to $S_{-1}$ and $S_1$ to $S_7$) each being modulated with the same data bit. Thus, in such an example the three successive data bits 1,0,1 would have the three corresponding OFDM symbols:

First data bit 1=>Symbol 430 (1): $S_{-8,7}$={1,1,1,1,1,1,1,1,DC,1,1,1,1,1,1,1}

Second data bit 0=>Symbol 430 (2): $S_{-8,7}$={0,0,0,0,0,0,0,0,DC,0,0,0,0,0,0,0}

Third data bit 1=>Symbol 430 (3): $S_{-8,7}$={1,1,1,1,1,1,1,1,DC,1,1,1,1,1,1,1}

In the example described above where M=16, OFDM symbol generation operation uses a 16 point inverse fast Fourier transform (IFFT) 405 to generate OFDM symbols 430. Using the above waveform numerology example, the bandwidth of OFDM symbols 430 is 5 MHz.

Guard interval insertion into the OFDM symbol 430 occurs at GI insertion operation 406. In the example numerology set out above, $T_{GI}$=¼ of the useful symbol time period (also referred to as the IFFT time period). The OFDM symbols 430 are then upconverted to a channel carrier frequency and transmitted through wireless network channel 410. In example embodiments, the same transmit filter used for 802.11 is used to provide spectral filtering to ensure that the transmitted OFDM symbols, including any edge tones beyond the M subcarriers, fall within a 20 MHz spectral mask.

Accordingly, the AP transceiver 110 encodes the data contained in WUP 250 and transmits in channel 410 a corresponding OOK mapped, OFDM based WUP signal 250T, in which each data bit from the original source WUP 250 is encoded as a single OFDM symbol.

At WUR 108, the OFDM based WUP signal 250T is received at WUR 108 and down converted to baseband. Envelope detection operation 412 and hard decision operation 414 are then used to extract the N bits that correspond to the WUP 250 from the N symbols contained in the down converted signal. In example embodiments, the design of the OFDM based WUP signal is such that envelope detection can be accurately performed at the WUR 108 without any need to perform channel estimation or equalization. WUR 108 does not operate as a conventional OFDM receiver because it does not include GI removal and FFT processing—rather, WUR 108 relies on envelope detection/hard decision operations 412/414 to recover WUP data bits. In this regard, envelope detection operation 412 relies on a low pass filter (LPF) 420 having a set of shift registers 422. In example embodiments, the number of coefficients (also referred to as taps) for the low pass filter is selected to be equal to the number of active subcarriers multiplied by the guard interval to useful symbol time ratio ($T_{GI}/T_U$). For example, using the numerology described above where M=16 and $T_{GI}$=¼ of useful symbol time, the number of LPF coefficients would be 4. The shift registers 422 are each initialized with predetermined values that are specifically selected to be different than the incoming symbols.

The hard decision operation 414 is configured to apply a decision threshold level to the output of envelope detection operation 412 to determine a "0" or "1" bit output. In example embodiments, the threshold applied by the hard decision operation 414 is set depending on the quality of the channel 410 between the AP transceiver 110 and WUR 108. In some applications, the decision threshold is set at the time that the station 104 that contains the WUR 108 is initialized, and in some applications WUR 108 may be configured to continuously or periodically monitor channel quality and adaptively change the threshold applied by the hard decision operation 414 in dependence on the monitored channel quality. In examples, a channel quality is determined based on a channel a signal-to-noise ratio or as a function of the modulation and coding scheme (MCS) between the source and the receiver.

The N-bit output of hard decision operation 414 provides the recovered WUP 250R (with an intermediate block decoding operation 416 being applied in the event that block encoding occurred at AP transceiver 110). The recovered WUP 250R may for example contain information and instructions for internal wake-up signal 154 for the main WLAN transceiver circuit 106.

It will be appreciated from the above description that in at least some configurations an OOK mapped, OFDM based WUP signal enables a low power, simplified WUR 108 to be implemented.

As indicated above, in different embodiments different waveform numerology can be applied at AP transceiver 110. In this regard, in an alternative embodiment the system is configured to make use of existing 802.11a numerology but to use only a subset of the 64 available subcarriers, such that the numerology parameters would be: Number of available subcarriers 64, but only middle M subcarriers are used, where M=14 (including one DC null subcarrier); subcarrier spacing SS=312.5 kHz; $T_{GI}$=¼ of the useful symbol time period $T_u$; useful symbol time period $T_u$=3.2 µs; and total symbol period $T_{tot}$=4 µs. With M=14 and SS=312.5 kHz, the resulting signal bandwidth is 4.375 MHz. In such an embodiment, 13 out of 14 subcarriers of the OFDM symbol would be modulated with the same OOK mapped data bit (with a central subcarrier being the DC null), and the remaining 50 subcarriers being set to zero.

Figure 4:
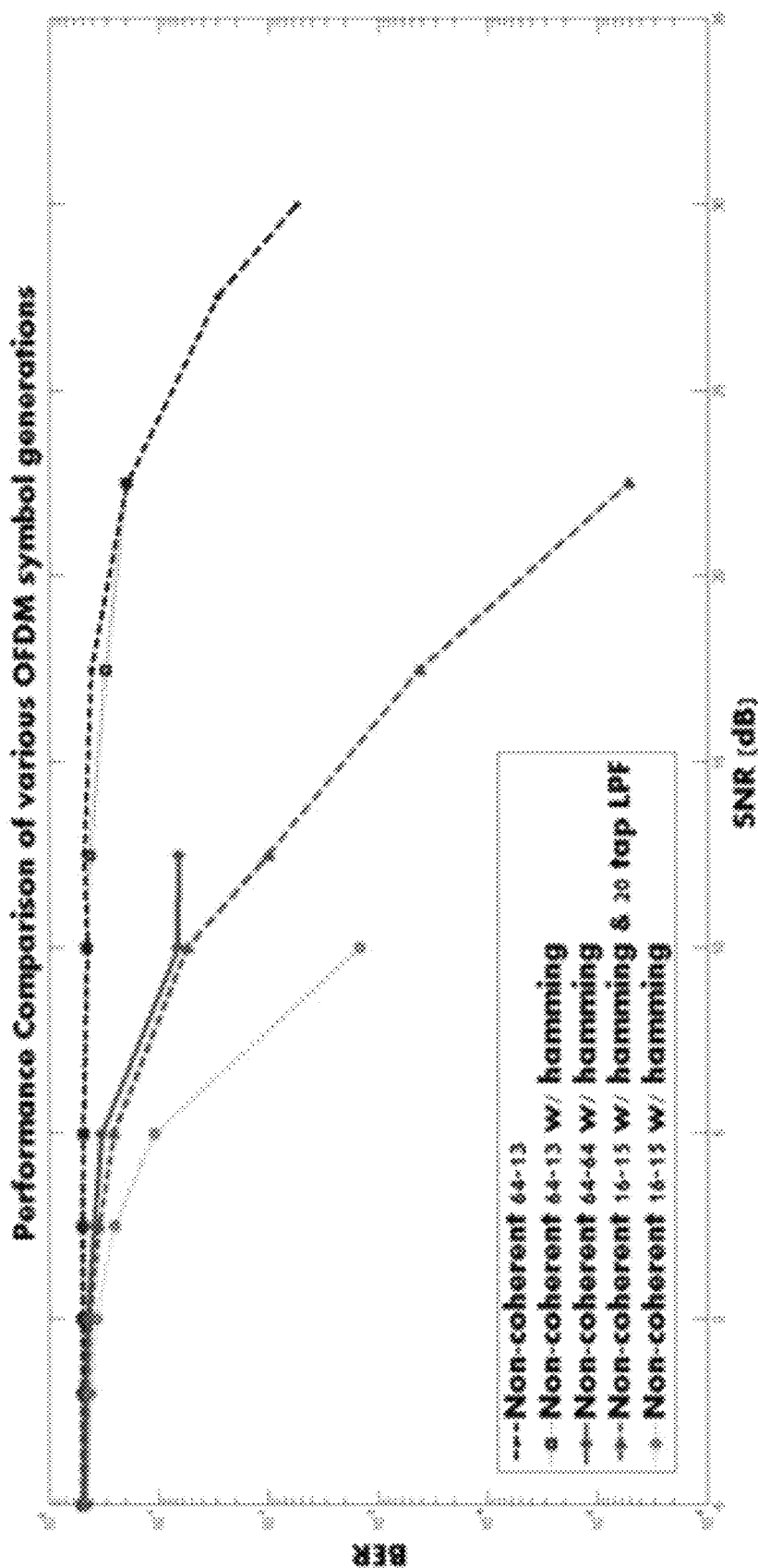
FIG. 4 is a chart showing a bit error rate (BER) performance comparison of various OFDM signals.
Figure 5:
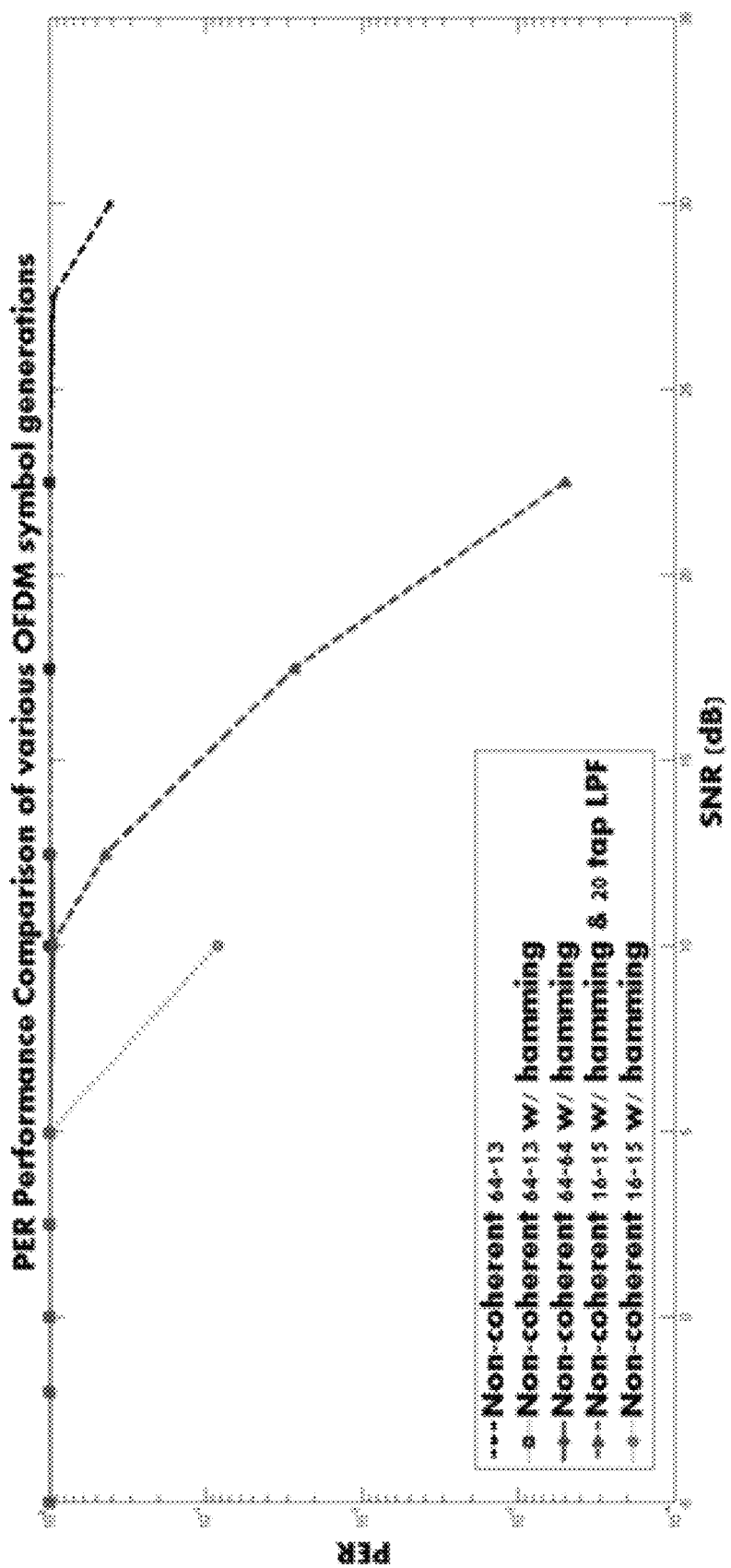
FIG. 5 is a chart showing a packet error rate (PER) performance comparison of various OFDM signals.

Thus, in such an example the three successive data bits 1,0,1 would have the three corresponding OFDM symbols:
First data bit 1=>: $S_{-7,6}$={1,1,1,1,1,1,1,DC,1,1,1,1,1,1};
  $S_{-32,-8}$ and $S_{7,31}$ all=0
Second data bit 0=>$S_{-7,6}$={0,0,0,0,0,0,0,DC,0,0,0,0,0,0};
  $S_{-32,-8}$ and $S_{7,31}$ all=0
Third data bit 1=>$S_{-7,6}$={1,1,1,1,1,1,1,DC,1,1,1,1,1,1};
  $S_{-32,-8}$ and $S_{7,31}$ all=0
FIGS. 4 and 5 show simulated performance comparisons for various OFDM based symbol configurations in the context of the system of FIG. 3. Bit Error Rate (BER) and Packet Error Rate (PER) are respectively illustrated in FIGS. 4 and 5.

In the examples represented by FIGS. 4 and 5, all the detection methods are non-coherent envelop detection, without channel estimation or equalization. In the simulation, a WUP length of 96 bits was used. The labels in FIGS. 4 and 5 identify the number of available subcarriers and the number of tones used, excluding the DC null (e.g. 64-13 means 64 subcarriers, with 13 tones occupied), and if Hamming codes were used. The length of the WUP was 96 bits. As indicated, one OFDM symbol was tested without Hamming codes. When applied, the Hamming code used 7 coded bits, 4 information bits with one bit correction capability.

As shown in the Figures, the 64 tone OFDM symbol with only 13 tones occupied with repeated input bits (Non-coherent 64-13) shows almost the same performance as the same OFDM symbol with the (7,4) Hamming codes (Non-coherent 64-13 with hamming code), except for the SNR range between 23 dB and 30 dB. The performance of 64 tone OFDM symbol with all 64 tones occupied by the repeated input bits (Non-coherent 64-64 with hamming code) excluding 1 DC and 7 edge tones shows about 15 dB better performance than the Non-coherent 64-13 with hamming code.

The OFDM scheme first discussed above, namely 16 tone OFDM symbol with 15 tones occupied with repeated input bits (Non-coherent 16-15 with hamming code) and an LPF filter with 4 taps (i.e. number of filter coefficients equal to number of subcarriers multiplied by the ratio of the guard interval period to useful symbol time), provides the best performance in the simulations represented in FIGS. 4 and 5. As seen in the figures increasing the number of taps to 20 does not improve performance, and in fact provides suboptimal performance as seen in Non-coherent 16-15 with hamming code & 20 tap LPF curve.

Wake Up Radio Frame with OFDM Based Manchester-Encoded MCM Data

A further example embodiment of wake up radio frame will now be described.

An OFDM based and OOK (On-Off Keying) modulated waveform design for a WUR has been proposed in Minyoung Park, et. al. "16/0341r0, LP-WUR (Low-Power Wake-Up Receiver) Follow-Up", IEEE 802.11 LRLP TIG, March 2016, where only 13 sub-carriers out of 64 sub-carriers are occupied for a data 1 case, and all 64 sub-carriers are assigned to zero for a data 0 case. However, the no energy transmission condition associated with consecutive data OFF symbols (data 0) case can result in a coexistence issue with some 802.11 devices (and possibly non-802.11 devices) as a result. A further proposal, Eunsung Park, et. al. "16/1144r0, Further Investigation on WUR Performance", IEEE 802.11 WUR SG, September 2016, introduces Manchester-coding to remedy the problem caused by the no energy transmission condition. However, in at least some simulations, it has been observed that extra waveform-coding like Manchester-coding can agitate the signal within the original bandwidth (BW) such that the WUR frame cannot be detected correctly by a WUR having an RF filter with a certain bandwidth.

Accordingly, example embodiments are disclosed herein for a WUR Frame configuration that mitigates bandwidth agitation when waveform-coding is applied. In particular, in an example embodiment, Manchester-coding is applied in the time domain to the OOK data in the context of the OFDM waveform first described above in respect of FIGS. 3 and 4, namely a waveform having the numerology attribute set of: total number of subcarriers M=16 (including one DC null subcarrier, leaving 15 available subcarriers); subcarrier spacing SS=312.5 kHz; $T_{GI}$=¼ of the useful symbol time period $T_u$; useful symbol time period $T_u$=3.2 µs; and total symbol period $T_{tot}$=4 µs. With M=16 and SS=312.5 kHz, the resulting signal bandwidth is 5 MHz.

Figure 6:
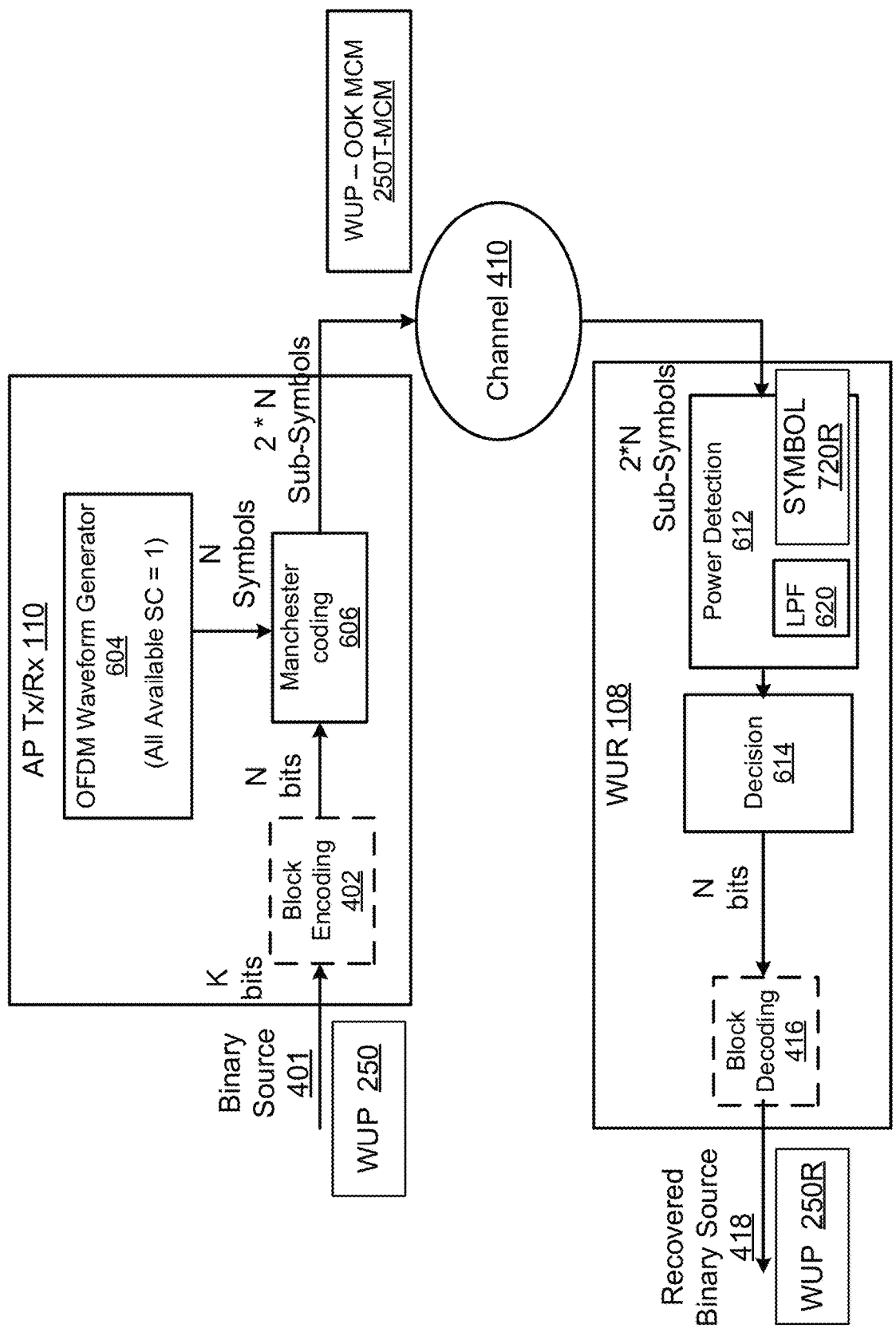
FIG. 6 is a block diagram illustrating a wake-up packet encoding and decoding system according to a further example embodiment.

In this regard, FIG. 6 is a basic system block diagram illustrating an OFDM based MCM system that employs Manchester-encoding of OOK based data. In particular, FIG. 6 shows the process flow applied at the AP transceiver 110 and the WUR circuit 108 to WUP 250. In some examples, each processing block 612, 614, 416 shown as being performed at WUR circuit 108 represents an operation that may be implemented as a module or element that is part of a common integrated circuit. Similarly, each processing block 402, 604, 606 shown as being performed at AP transceiver 110 represents an operation that may for example be implemented as a module or element of a common integrated circuit.

As shown in FIG. 6, WUP 250 is provided as an OOK mapped binary source 401 input to AP transceiver 110. In some examples, block encoding to apply error correction and/or compress data (e.g. encoding K bits to N bit codewords) can be applied to the binary source 401 by a block encoding operation 402, however such encoding is optional.

AP transceiver 110 includes an OFDM waveform generator operation 604 that is configured to output a OFDM waveform having the numerology parameters: M=16 (with $S_0$ used for a DC null); $T_u$=3.2 µs; and SS=312.5 kHz, with all available 15 subcarriers ($S_{-8}$ to $S_{-1}$ and $S_1$ to $S_7$) set to "1". An example illustration of the OFDM waveform 710 for an OFDM symbol as output by OFDM waveform generator 604 is shown in time domain in FIG. 7. In the illustrated example, the OFDM waveform 710 represents the output of a 16 point inverse fast Fourier transform (IFFT) operation in which a "1" has been modulated onto 15 subcarriers, and one of the subcarriers (for example $S_0$) used as a DC null. In the embodiment, of FIG. 6, the OFDM waveform generator 604 will effectively be generating the same waveform continuously and accordingly, a sample waveform could be stored, with the OFDM waveform generator 604 simply repeating the sample waveform, which would eliminate the need for an IFFT operation at OFDM waveform generator 604.

In the example of FIG. 6, Manchester-coding operation 606 is used to code the N data bits onto the OFDM waveform 710. As known in the art, Manchester-coding (also known as phase-encoding (PE)) is a line code in which the encoding of each data bit is either low then high, or high then low, of equal time. Accordingly, in the context of an OFDM waveform, the OFDM symbol is effectively divided into two sub-symbols of equal duration, in which each "0" bit is encoded as a set of two sub-symbols, and each "1" bit is encoded as set of two sub-symbols. In an example embodiment, the encoding is as shown in the following table (although the reverse coding can be used in other embodiments):

TABLE 1

Manchester-encoding of OOK data bits:

| OOK Data Bit | First sub-symbol $SUB_1$ | Second sub-symbol $SUB_2$ |
|---|---|---|
| "1" | 1 (ON) | 0 (OFF) |
| "0" | 0 (OFF) | 1 (ON) |

Figure 7:
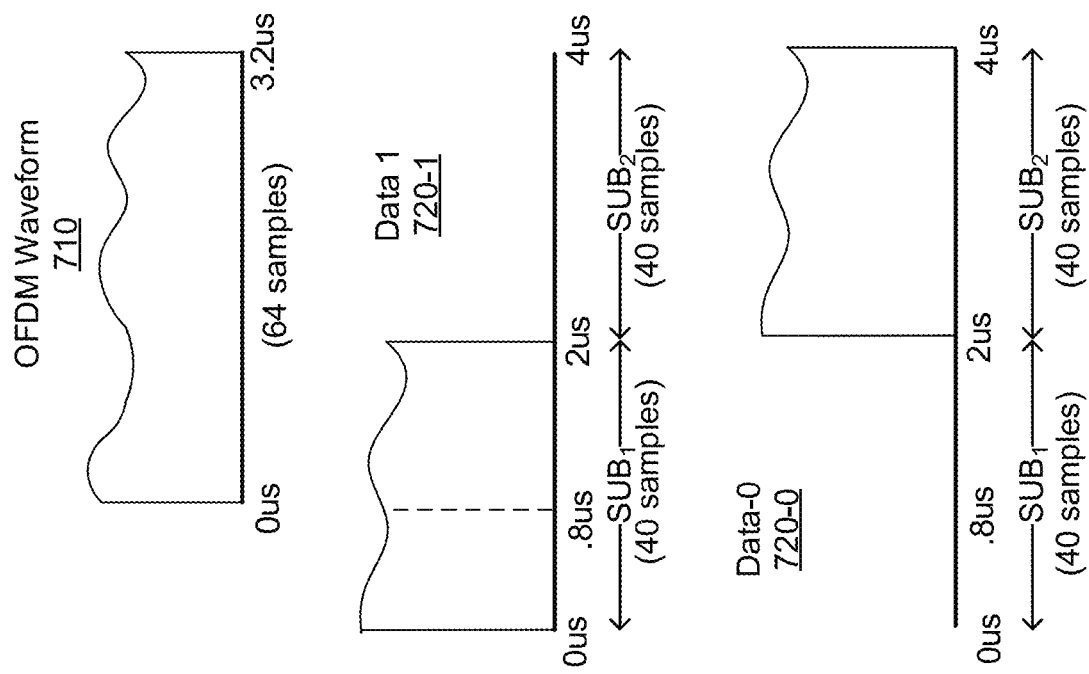
FIG. 7 is a time domain representation of example waveforms generated by the system of FIG. 6.
Figure 8:
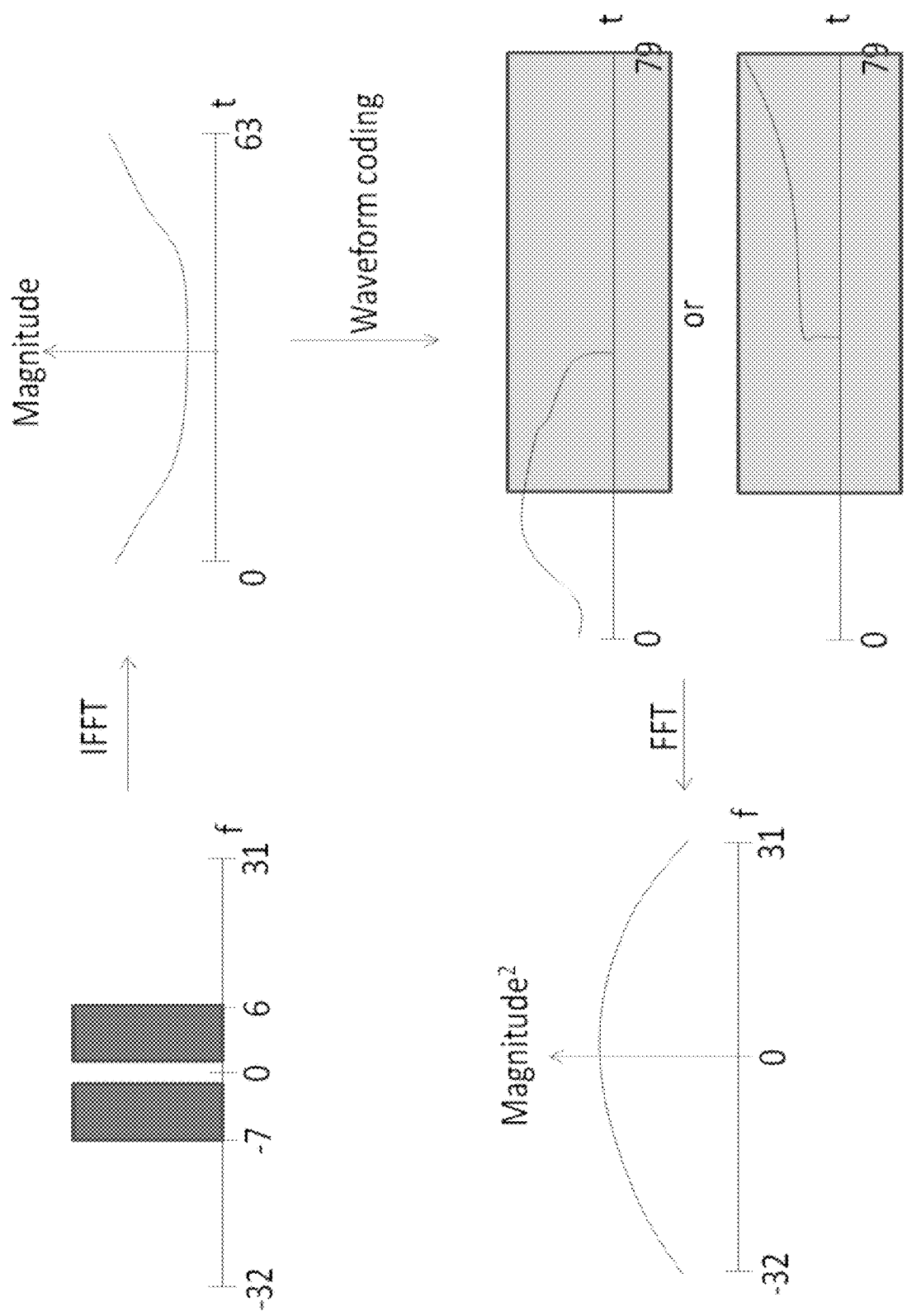
FIG. 8 shows an example of a simulated case analysis procedure to illustrate an example embodiment.
Figure 9:
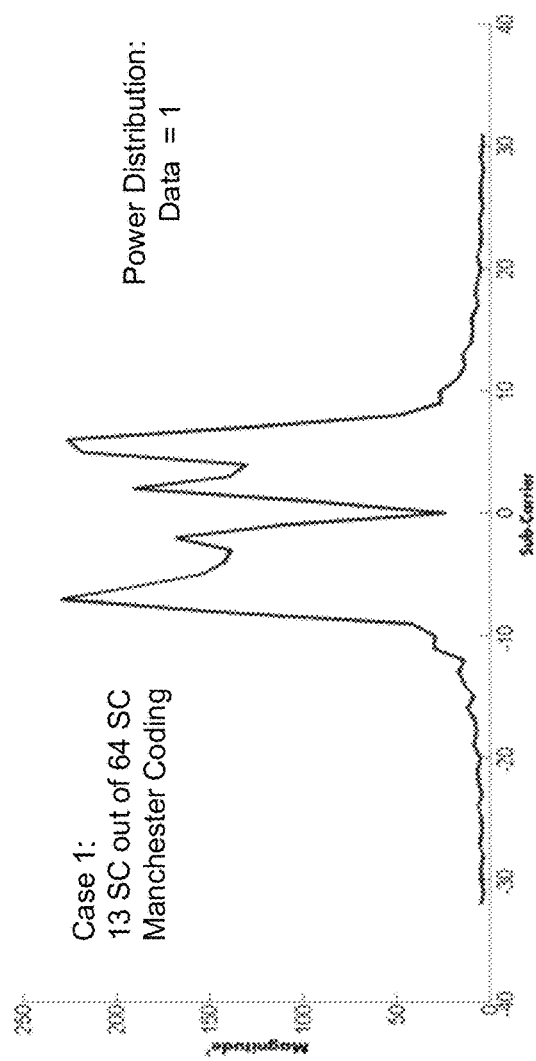
FIGS. 9 and 10 respectively show frequency domain power distribution for "1" and "0" sub-symbols for a first case.
Figure 10:
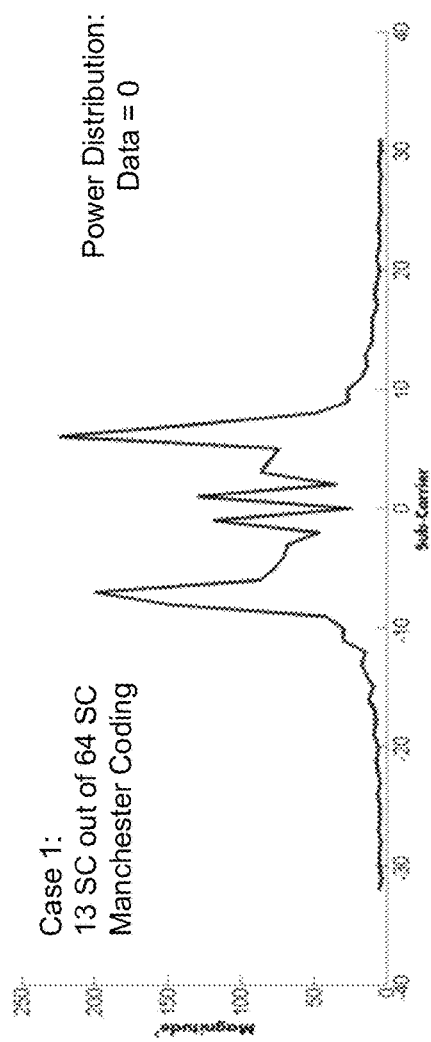
Figure 11:
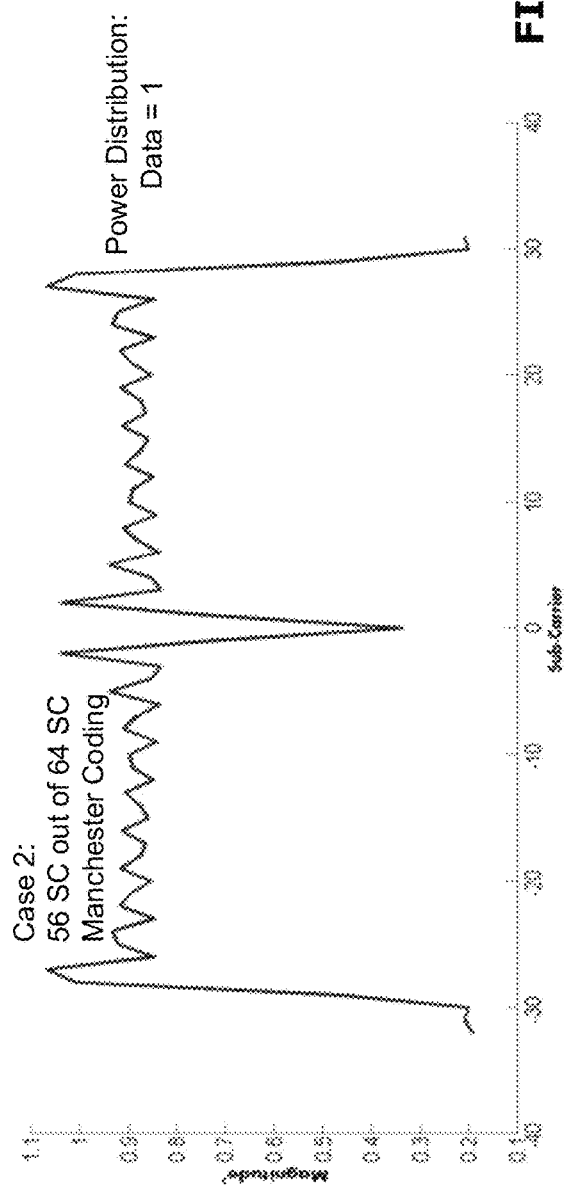
FIGS. 11 and 12 respectively show frequency domain power distribution for "1" and "0" sub-symbols for a second case.
Figure 12:
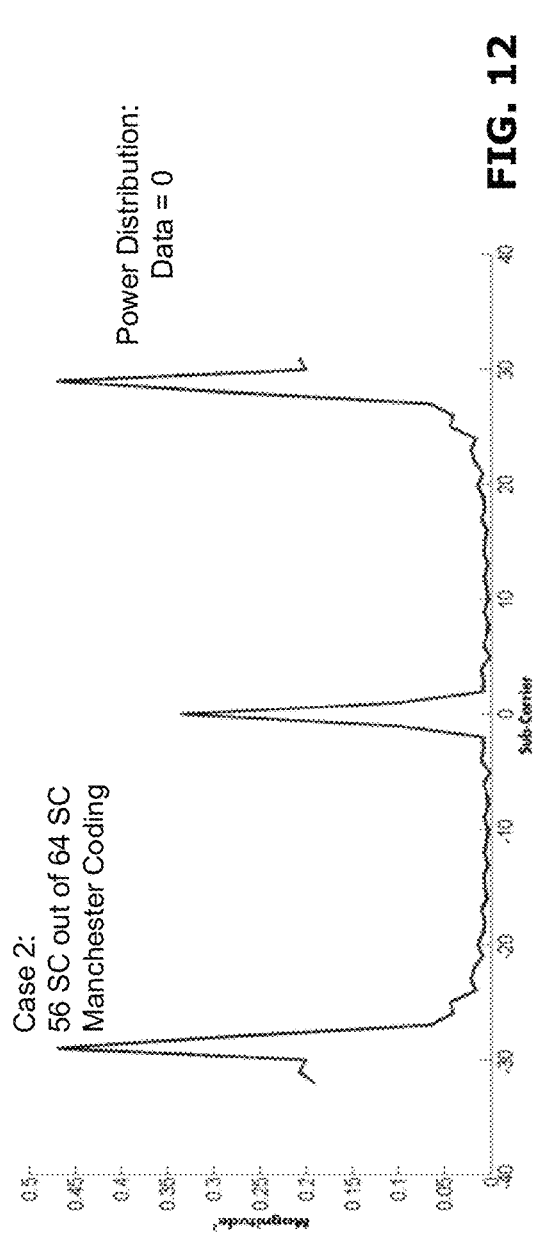
Figure 13:
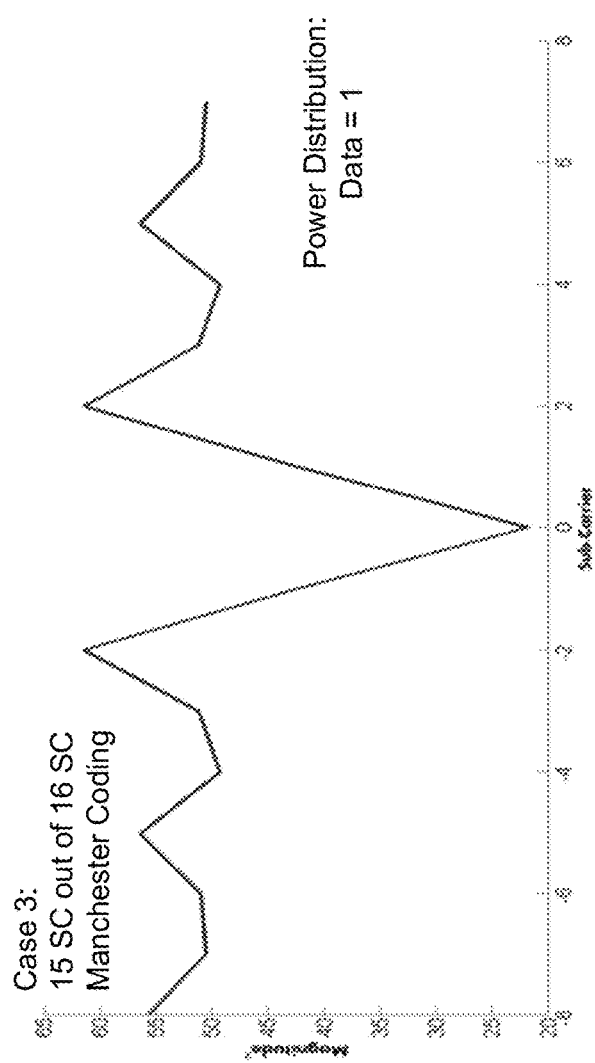
FIGS. 13 and 14 respectively show frequency domain power distribution for "1" and "0" sub-symbols for a third case.
Figure 14:
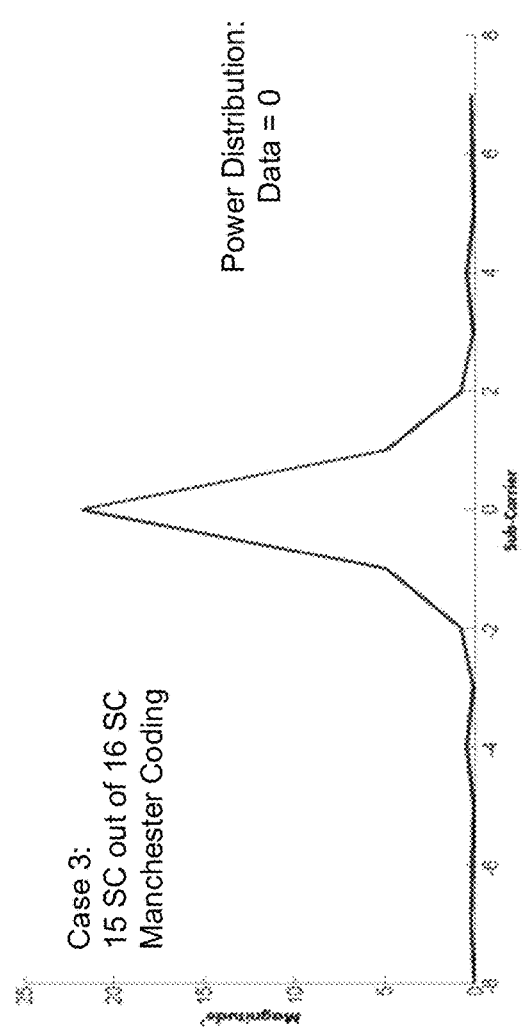

Manchester-coding operation 606 applies the PE coding to the OFDM waveform 710 in the time domain, and in this regard, FIGS. 7 and 8 graphically illustrate, in time domain and frequency domain, respectively, the coding that is applied to OFDM waveform 710 to generate a data "1" symbol 720-1 and a data "0" symbol 720-0 (generically referred to herein as data symbol 720).

In example embodiments, the standard 802.11 sampling rate of 20 MHz is applied by Manchester-coding operation 606 when generating the data symbols 720. In this regard, the base OFDM waveform useful symbol duration of $T_u$=3.2 µs includes 64 samples. In typical 802.11 configurations, a 0.8 µs GI insertion occurs to being the total symbol time period $T_{tot}$ to 4.0 µs, which corresponds to 80 samples at 20 MHz. In example embodiments, the Manchester-coding operation 606 is configured to include the equivalent of a GI to output symbols that have a total symbol time period $T_{tot}$ to 4.0 µs. Accordingly, in the case of a Data "1", the output symbol 720-1 includes a first sub-symbol $SUB_1$ of duration $T_{s1}$=$T_{tot}$/2=2.0 µs that includes 40 samples copied from the OFDM waveform 710, followed by a second sub-symbol $SUB_2$ of duration $T_{s2}$=$T_{tot}$/2=2.0 µs that includes 40 samples in which the sub-carrier values have been forced to "0". In the case of data "0" output symbol 720-0, the above order is reversed.

Thus, in example embodiments, each OOK mapped data bit is represented at the output of Manchester-coding operation 606 as two Multicarrier modulated (MCM) sub-symbols such that N data bits results in N symbols, containing a total of 2 N successive-sub symbols. The resulting MCM symbols are then upconverted to a channel carrier frequency and transmitted as Manchester-coded OFDM based MCM WUP signal 250T-MCM through wireless network channel 410. In example embodiments, the same transmit filter used for 802.11 is used to provide spectral filtering to ensure that the transmitted OFDM symbols, including any edge tones beyond the M subcarriers, fall within a 20 MHz spectral mask At WUR 108, the OFDM based WUP signal 250T-MCM is received as part of wake-up signal 152 at WUR 108 and down converted to baseband. In example embodiments, one or more of WUR-Reference Signal 252 and/or Legacy preamble 210 as encoded in the wake-up signal 152 allow WUR 108 to synchronize sample timing to the incoming symbol boundaries. Power detection operation 612 is configured to measure the power distribution of each received symbol 720R, and in particular to determine a power level of the first sub symbol and the second sub-symbol in each received symbol 720R. In the example of a 20 MHz sampling rate, the first sub-symbol $SUB_1$ and second sub-symbol $SUB_2$ each include 40 samples. Decision block 614 is configured to compare the power distribution between the first and second halves of the symbol and make a corresponding data "0" or "1" decision. In the illustrated example, if the average power magnitude is greater in the first sub-symbol than the second sub-symbol, then the received symbol 720R is decoded as a data "1"; and if the average power magnitude is greater in the second sub-symbol than the first sub-symbol, then the received symbol 720R is decoded as a data "0". The recovered WUP 250R (with an intermediate block decoding operation 416 being applied in the event that block encoding occurred at AP transceiver 110). The recovered WUP 250R may for example contain information and instructions for internal wake-up signal 154 for the main WLAN transceiver circuit 106.

In example embodiments, a Low Pass Filter 620 is included in power detection operation 612 to apply low pass filtering to received symbols 720R prior to power analysis. In example embodiments, the filter bandwidth is greater than the transmission bandwidth.

An analysis of a Manchester-coded OFDM based MCM WUP as discussed above was performed by comparing three MCM numerology cases: A first case (case 1) used 13 tone occupancy out of 64 sub-carriers; a second case (case 2) used 56 tone occupancy out of 64 sub-carriers; and the third case used 15 tone occupancy out of 16 sub-carriers as disclosed in the example embodiment described above. FIG. 8 shows a graphical representation of the procedure to perform a BW analysis for the three cases. In the analysis, waveform-coding (WFC) was applied in time domain, and an FFT was performed on the subcarriers (without a Guard Interval (GI)) to get the power distribution (Magnitude squared of each sub-carrier) in the frequency domain. The resulting power distributions in the frequency domain are shown in FIGS. 9-14. The energy leakage beyond 4 MHz for case 1 can be seen in FIGS. 9 and 10, which results in poor performance at the receiver.

Figure 15:
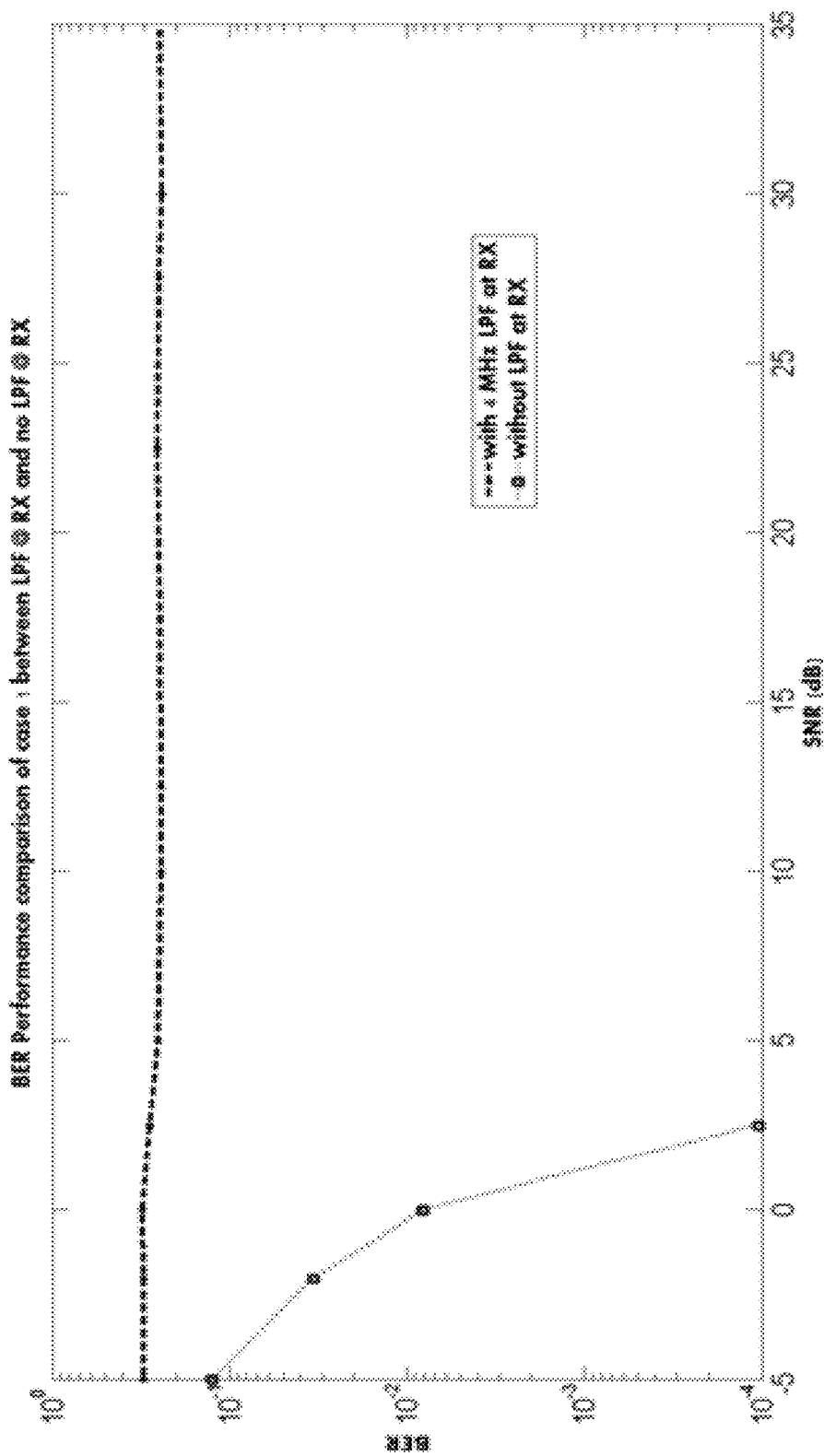
FIG. 15 shows a BER performance comparison for the first case, comparing performance of a 4 MHz low pass filter at a receiver and no low pass filter.
Figure 16:
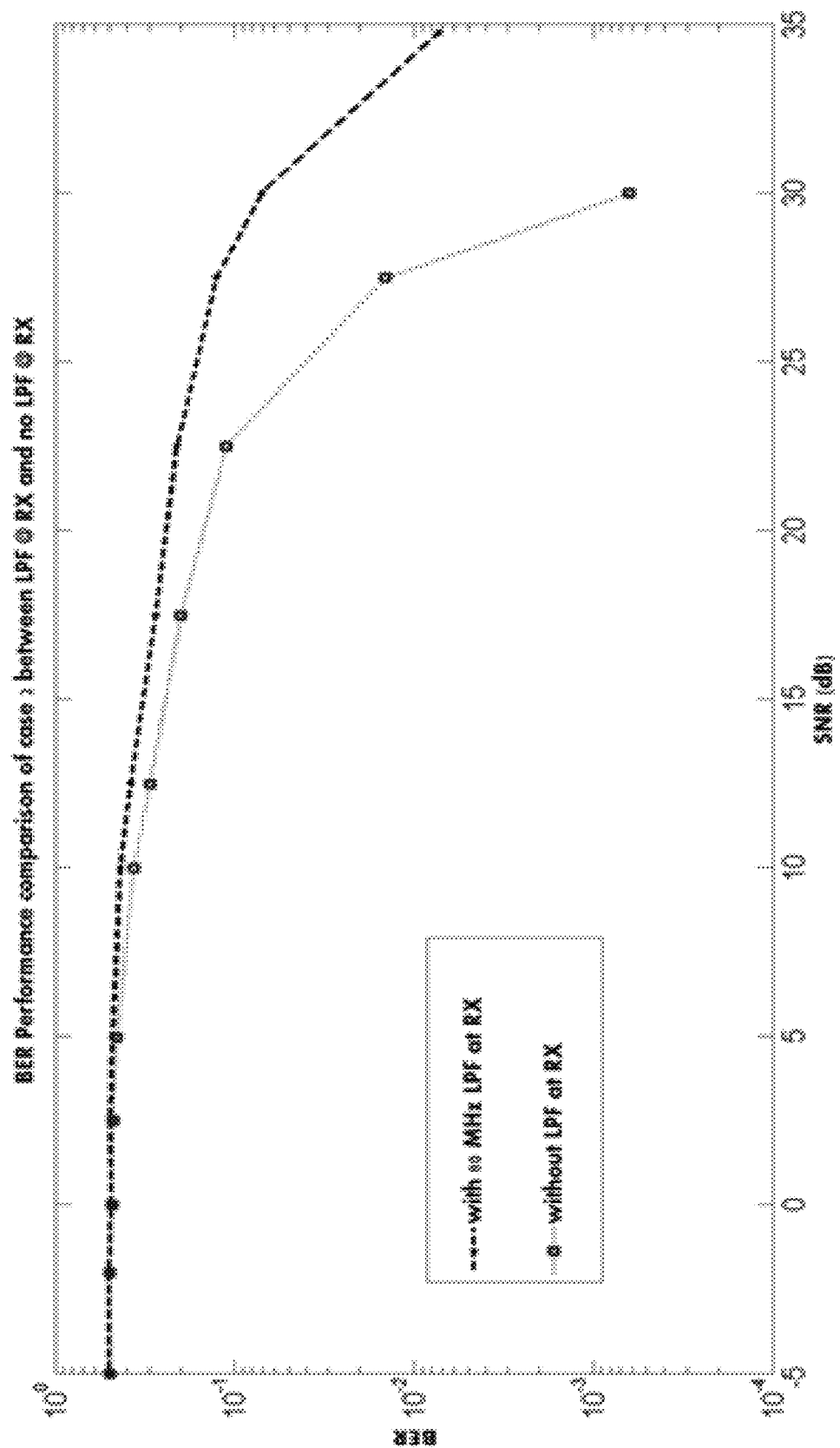
FIG. 16 shows a BER performance comparison for the second case, comparing performance of a 20 MHz low pass filter at a receiver and no low pass filter.
Figure 17:
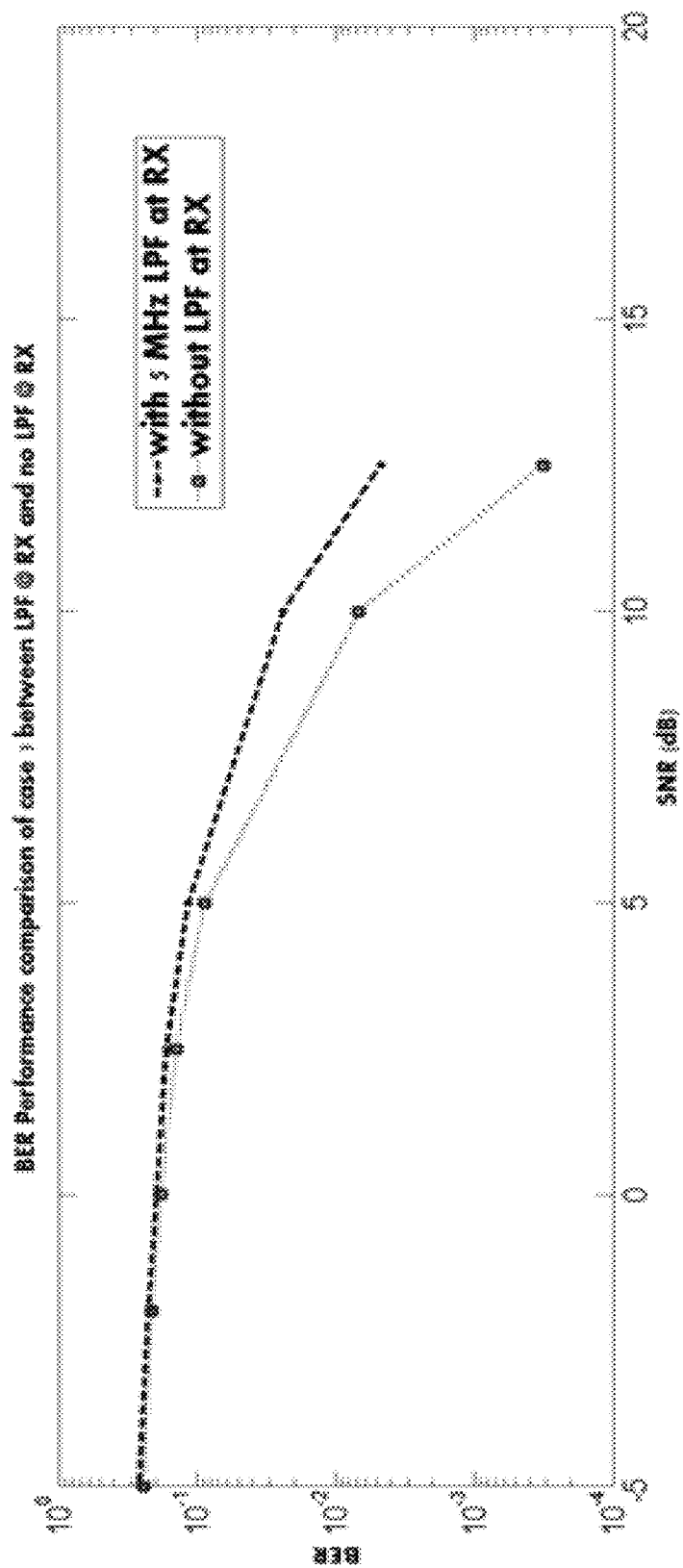
FIG. 17 shows a BER performance comparison for the third case, comparing performance of a 5 MHz low pass filter at a receiver and no low pass filter

FIGS. 15, 16 and 17 show the Bit Error Rate (BER) Performances of the three cases, respectively. The original BW of each case is 4 MHz, 20 MHz, and 5 MHz, respectively, and thus, the performance comparisons between having a 4 MHz (20, and 5 MHz for the case 2 and 3) Low Pass Filter (LPF) at the receiver and no LPF are given in FIGS. 15, 16, and 17. FIG. 15 shows a BER performance comparison for the first case, comparing performance of a 4 MHz low pass filter at a receiver and no low pass filter; FIG. 16 shows a BER performance comparison for the second case, comparing performance of a 20 MHz low pass filter at a receiver and no low pass filter; and FIG. 17 shows a BER performance comparison for the third case, comparing performance of a 5 MHz low pass filter at a receiver and no low pass filter.

These simulations are obtained for the AWGN channel with RF impairments (Carrier Frequency Offset and Phase Noise) considered. As can be seen from the FIGS. 15, 16 and 17, when the LPF is applied at the receiver, the performance degradation is severe for the case 1, whereas the degradation for case 3 is minimal. For the case 2, the TX power per tone is lower than the narrowband transmission (the other two cases), which may cause inferior performance compared to the other two cases, even if no LPF is used at the receiver.

Wake Up Radio Frame with Alternating Carrier Manchester-Encoded MCM Data

Yet a further example embodiment of wake up radio frame will now be described. As noted above, an OFDM based and OOK (On-Off Keying) modulated waveform design for a WUR has been proposed in Minyoung Park, et. al. "16/0341r0, LP-WUR (Low-Power Wake-Up Receiver) Follow-Up", IEEE 802.11 LRLP TIG, March 2016, where only 13 sub-carriers out of 64 sub-carriers are occupied for a data 1 case, and all 64 sub-carriers are assigned to zero for a data 0 case. As noted above, a further proposal, Eunsung Park, et. al. "16/1144r0, Further Investigation on WUR Performance", IEEE 802.11 WUR SG, September 2016, introduced Manchester-coding applied to remedy the problem caused by the no energy transmission condition. Eunsung Park et al. disclosed a solution in which Manchester-coding is applied to only seven (7) alternating middle tones (excluding the DC tone) out of 64 total tones. In Eunsung Park et al. a guard interval is added after Manchester-Coding has occurred. The use of 7 of the middle 14 tones results in less energy leakage than the case where 13 of the middle 14 tones are used, however the performance over a fading channel shows little gain over an OOK-coded waveform without Manchester-coding.

Accordingly, a further embodiment is disclosed herein for a WUR Frame waveform-coding that mitigates against energy leakage and may also improve fading channel performance. In one example, Manchester-coding is applied in the time domain to a subset of the subcarriers of an OFDM waveform after guard interval insertion has occurred.

Figure 18:
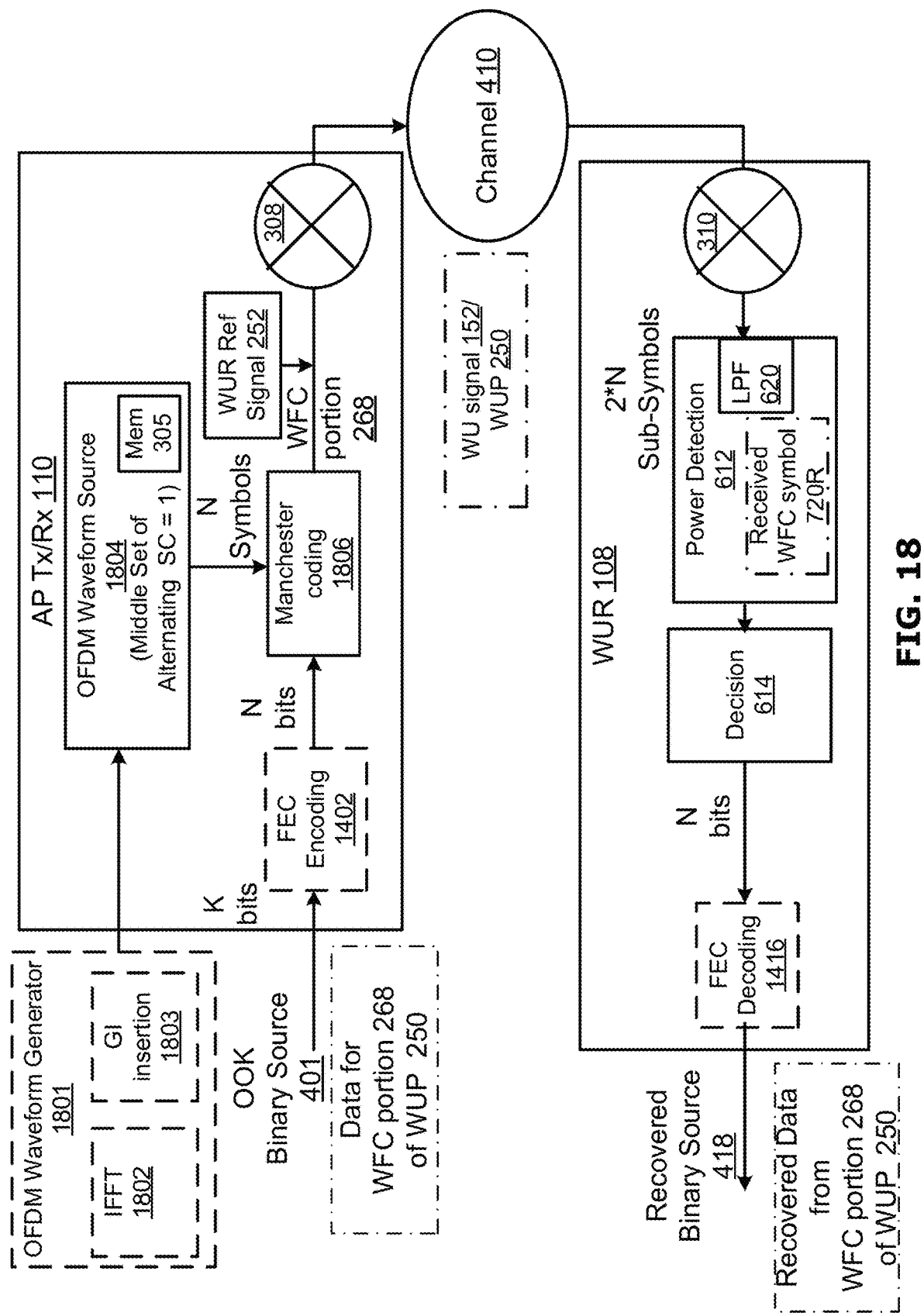
FIG. 18 is a block diagram illustrating a wake-up packet encoding and decoding system according to a further example embodiment.

In this regard, FIG. 18 is a basic system block diagram illustrating a further OFDM based MCM system that also employs Manchester-encoding of OOK based data. The system of FIG. 18 is similar to that of FIG. 6, with differences that will be apparent from the Figures and the description. FIG. 18 shows the process flow applied at the AP transceiver 110 and the WUR circuit 108 to WUP 250. In some examples, each processing block 612, 614, 1416 shown as being performed at WUR circuit 108 represents an operation that may be implemented as a module or element that is part of a common integrated circuit. Similarly, each processing block 1402, 1804, 1806 shown as being performed at AP transceiver 110 represents an operation that may for example be implemented as a module or element of a common integrated circuit.

As shown in FIG. 18, WUP 250 is provided as an OOK mapped binary source 401 input to AP transceiver 110. In particular, in some examples, OOK binary source 401 includes source data bits for a portion of WUP 250 that is to be wave-form coded (wave-form coded (WFC) portion 268 of WUP 250—See FIG. 2), including for example the WUR-SIG 245, MAC-Header 262, Frame Body 264 and FCS 266 data fields. In some examples, forward error correction (FEC) encoding to apply error correction and/or compress data (e.g. encoding K bits to N bit codewords) can be applied to the binary source 401 by an FEC encoding operation 1402, however such encoding is optional.

Figure 19:
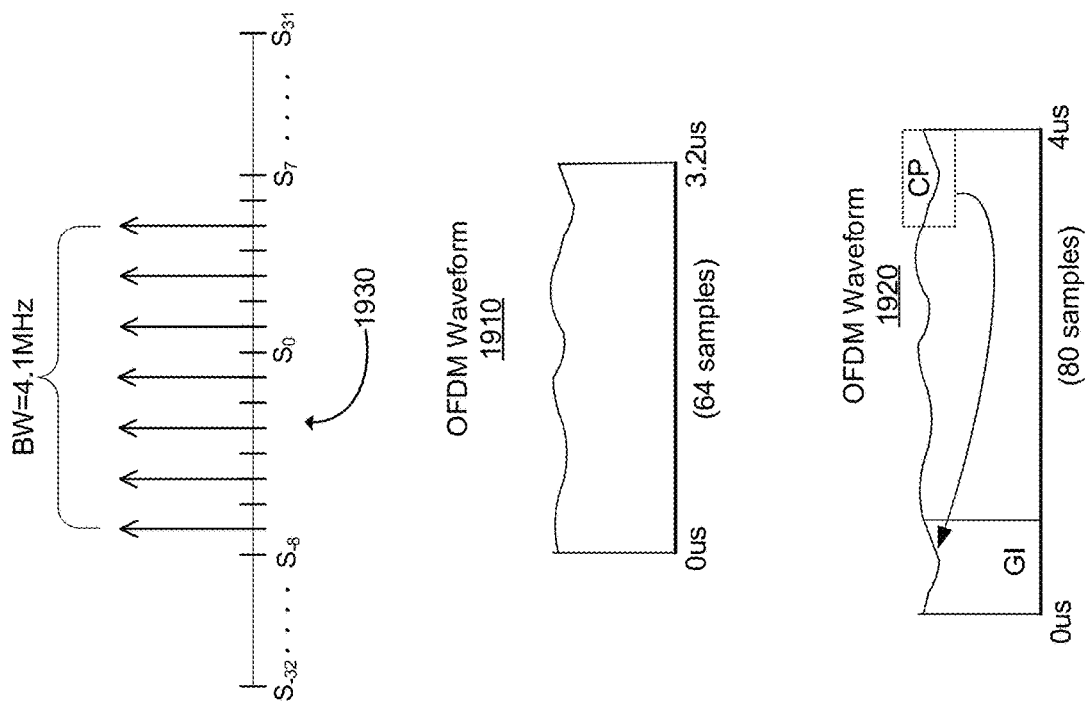
FIG. 19 shows frequency domain and time domain representations of example waveforms used in the system of FIG. 18.

AP transceiver 110 includes an OFDM waveform source 1804. In one example, OFDM waveform source 1804 includes memory 305 that stores a previously generated time domain version of OFDM waveform such as the example time domain OFDM symbol waveform 1920 that is shown in FIG. 19. In particular, in an example embodiment, an OFDM waveform generator 1801 that includes a 64 point inverse fast Fourier transform (IFFT) operation 1802 is used to generate an frequency domain OFDM symbol 1930 in which a sub-set of alternating central subcarriers are set to 1 and the remaining subcarriers are set to 0. In the illustrated example symbol 1930 of FIG. 19, central subcarrier $S_0$ is a DC Null, and the seven alternating subcarriers $S_{-7}$, $S_{-5}$, $S_{-3}$, $S_{-1}$, $S_1$, $S_3$, $S_5$ are set to one. The remaining subcarriers $S_{-32}$ to $S_{-8}$, $S_{-6}$, $S_{-4}$, $S_{-2}$, $S_2$, $S_4$, $S_6$ to $S_{31}$ are each set to 0. In the illustrated example, the symbol 1930 is derived from a conventional 802.11 OFDM symbol having the numerology parameters: Number of subcarriers=64, with number of used subcarriers M=13 ($S_{-7}$ to $S_5$ with $S_0$ used for a DC null); useful symbol duration $T_u$=3.2 µs; and subcarrier spacing SS=312.5 kHz, with the alternating 7 subcarriers of the middle 13 subcarriers set to "1". As shown in FIG. 19, the useful bandwidth BW of symbol 1930 is 13×312.5 kHz=4.1 MHz.

OFDM waveform 1910 in FIG. 19 represents a time domain version of OFDM symbol 1930. In an example embodiment, OFDM waveform generator 1801 also includes a GI insertion operation 1802 that operates in the time domain to copy a conventional 0.8 µs cyclic prefix CP portion from the trailing end OFDM waveform 1910 and prepend it to provide a guard interval GI, with the result that OFDM symbol waveform 1920 has a total symbol duration of $T_{tot}$=4 µs. In example embodiments the standard 802.11 sampling rate of 20 MHz, the OFDM symbol waveform 1920 includes 80 samples, including 16 samples that make up the GI.

As noted above, in example embodiments the operations performed by OFDM symbol generator 1801 to provide symbol waveform 1920 are done at a configuration time prior to WUP 250 transmission, with OFDM waveform source 1804 then providing successive copies of the pre-stored symbol waveform 1920 at the time of WUP 250 transmission by AP Tx/Rx 110, thus eliminating the requirement for an IFFT operation for each symbol waveform used for WUP 250. In at least some example embodiments, OFDM waveform generator 1801 is configurable and can be used to generate symbol waveforms 1920 that have different numerology parameters than those stated above, such that the stored waveform 1920 can be changed if required.

In the example of FIG. 18, a wave-form coding operation such as Manchester-coding operation 1806 is used to code the N data bits onto N successive OFDM symbol waveforms 1920 to generate WFC portion 268 of WUP 250. As indicated above, Manchester-coding (also known as phase-encoding (PE)) is a line code in which the encoding of each data bit is either low then high, or high then low, of equal time. Accordingly, in the context of an OFDM waveform, the OFDM symbol is effectively divided into two sub-symbols of equal duration with each "0" bit is encoded as a set of two sub-symbols and, each "1" bit is encoded as set of two sub-symbols. In an example embodiment, the encoding is as shown in Table 1 above.

Figure 20:
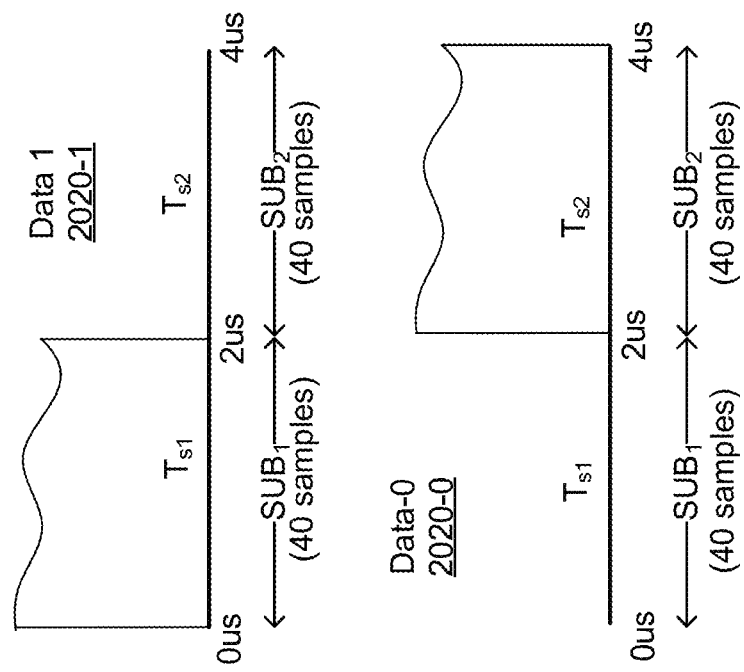
FIG. 20 shows time domain representations of example coded waveforms used in the system of FIG. 18.

Manchester-coding operation 1806 applies the PE coding to the OFDM symbol waveform 1920 in the time domain, and in this regard, FIG. 20 graphically illustrates, in time domain, the coding that is applied to OFDM symbol waveform 1920 to generate a data "1" symbol 2020-1 and a data "0" symbol 2020-0 (generically referred to herein as data symbol 2020).

In some example embodiments, the standard 802.11 sampling rate of 20 MHz is applied by Manchester-coding operation 1806 when generating the data symbols 2020. Accordingly, in the case of a Data "1", the output symbol 2020-1 includes a first sub-symbol $SUB_1$ of duration $T_{s1}=T_{tot}/2=2.0$ µs that includes 40 samples copied from the source OFDM symbol waveform 1920, followed by a second sub-symbol $SUB_2$ of duration $T_{s2}=T_{tot}/2=2.0$ µs that includes 40 samples in which the sub-carrier values have been forced to "0". In the case of data "0" output symbol 2020-0, the above order is reversed.

In some examples, the number of OFDM symbol waveforms 1910 used to code each OOK data bit at Manchester-coding operation 1806 can be more than one. By way of example, in some embodiments two OFDM symbol waveforms 1910 are used for each data bit—for example a data bit "1" includes a copy of the entire duration of a OFDM symbol waveform 1910 followed by an identical duration in which all of the subcarriers have been forced to "0". A data bit "0" is represented by a "zero" symbol waveform followed by an entire duration of a OFDM symbol waveform 1910. In such an example, Manchester-coding for each data bit is applied across two OFDM symbols, such that, with reference to FIG. 20, $T_{tot}$=8 µs instead of 4 µs, and $T_{1s}$ and $T_{s2}$ are each 4 µs. The corresponding number of samples for $T_{1s}$ shall be 80 samples instead of 40 samples. Therefore, $T_{tot}$, $T_{s1}$, and $T_{s2}$ can be adjusted to a new duration for ON/OFF position in the Manchester-coded signal depending on performance, even though the OFDM symbol length and the GI length for source OFDM symbol waveform 1920 are unchanged. In this case, N data bits are not always represented as N OFDM symbols.

In some example embodiments, the total symbol duration and sampling rate applied at Manchester-coding operation 1806 can be different that the conventional 802.11 parameters indicated above. Furthermore, in some example embodiments the symbol duration and sampling rate applied at Manchester-coding operation 1806 may be configurable to allow for adjustment of the sampling rate (and resulting bandwidth) and symbol duration, thereby allowing the transmitted Wake-up signal 152 to be configured for operator and receiving device requirements.

Referring again to FIG. 18, in example embodiments, each OOK mapped data bit is represented at the output of Manchester-coding operation 1806 as two Multicarrier modulated (MCM) sub-symbols (2020-1 or 2020-0) such that N data bits results in N symbols, each containing 2 successive-sub symbols. In example embodiments, the WUR REF signal 252 is then prepended to the WFC portion 268, resulting in WUP 250. In configurations where legacy preamble 210 is required, the legacy preamble 210 can be prepended to the WUP 250 prior to up-conversion. The resulting WUR frame 200 (which includes the Manchester-coded OFDM based MCM symbols of WFC portion 268, prepended WUR REF signal 252, and, if required, prepended legacy preamble 210) are then up-converted at up-converting modulator 308 to a channel carrier frequency and transmitted as RF wake-up signal 152 through wireless network channel 410. In example embodiments, the same transmit filter used for 802.11 is used to provide spectral filtering to ensure that the transmitted OFDM symbols, including any edge tones beyond the M subcarriers, fall within a 20 MHz spectral mask.

At WUR 108, the OFDM based WUP 250 is received as part of wake-up signal 152 at WUR 108 and down converted at down converting modulator 310 to baseband. In example embodiments, one or more of WUR—Reference Signal 252 and/or Legacy preamble 210 as encoded in the wake-up signal 152 allow WUR 108 to synchronize sample timing to the incoming symbol boundaries of the WFC symbols 720R included in WFC portion 268 of incoming WUP 250. Power detection operation 612 is configured to measure the power distribution of each received WFC symbol 720R, and in particular to determine a power level of the first sub symbol and the second sub-symbol in each received symbol 720R. In the example of a 20 MHz sampling rate, the first sub-symbol $SUB_1$ and second sub-symbol $SUB_2$ each include 40 samples. Decision block 614 is configured to compare the power distribution between the first and second halves of the symbol and make a corresponding data "0" or "1" decision. In the illustrated example, if the average power magnitude is greater in the first sub-symbol than the second sub-symbol, then the received symbol 720R is decoded as a data "1"; and if the average power magnitude is greater in the second sub-symbol than the first sub-symbol, then the received symbol 720R is decoded as a data "0". The output of decision block 614 is the recovered data from WFC portion 268 of the received WUP 250 (with an intermediate FEC decoding operation 1416 being applied in the event that block encoding occurred at AP transceiver 110). The recovered data from WFC portion 268 may, for example, contain information and instructions for internal wake-up signal 154 for the main WLAN transceiver circuit 106.

In example embodiments, a Low Pass Filter (LPF) 620 is included in or prior to power detection operation 612 to apply low pass filtering to received symbols 720R prior to power analysis. In example embodiments, the filter bandwidth is greater than the transmission bandwidth.

Figure 21:
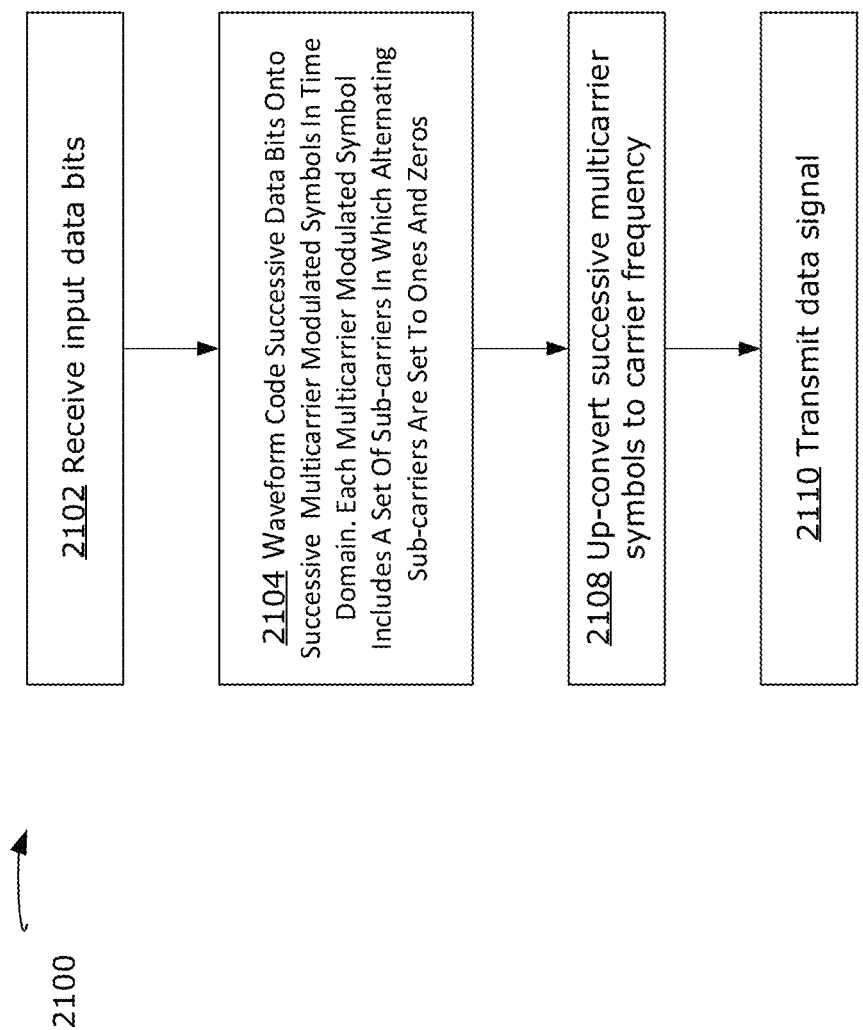
FIG. 21 is a flowchart illustrating an example method for providing a low-rate data signal.

FIG. 21 is a flowchart illustrating an example method 2100 for providing a low-rate data signal. The method 2100 may be performed by a transmitter of a low-rate data signal, for example at a transceiver 110 as shown in FIG. 18 of the AP transmitting a wake-up signal 152.

At 2102, input data bits are received. The input data bits may be data bits of the portion 268 of WUP 250, for example as described above, or other low-rate data signal. The input data bits may be mapped using OOK.

At 2104, waveform-coding is applied to successive on-off-keying (OOK) mapped data bits onto successive multicarrier modulated symbols in time domain, wherein each multicarrier modulated symbol includes a set of sub-carriers in which alternating sub-carriers are set to ones and zeros in frequency domain.

At 2108, the successive multicarrier symbols are up-converted to a carrier frequency to provide a data signal.

At 2110, the data signal is transmitted over a wireless channel.

The present disclosure may provide certain example algorithms and calculations for implementing examples of the disclosed methods and systems. However, the present disclosure is not bound by any particular algorithm or calculation.

Although the present disclosure may describe methods and processes with steps in a certain order, one or more steps of the methods and processes may be omitted or altered as appropriate. One or more steps may take place in an order other than that in which they are described, as appropriate.

Although the present disclosure may be described, at least in part, in terms of methods, a person of ordinary skill in the art will understand that the present disclosure is also directed to the various components for performing at least some of the aspects and features of the described methods, be it by way of hardware components, software or any combination of the two.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A method of providing a data signal, comprising:
storing, in a memory, a time-domain waveform of a multicarrier modulated symbol having a set of sub-carriers in which alternating sub-carriers are set to non-zeros and zeros in frequency domain, wherein the time-domain waveform represents an output of an inverse fast Fourier transform (IFFT) operation;
waveform-coding successive on-off-keying (OOK) mapped data bits using retrieved copies of the stored time-domain waveform to generate waveform coded multicarrier modulated data symbols;
up-converting the waveform coded multicarrier modulated data symbols to a carrier frequency to provide a data signal; and
transmitting the data signal over a wireless channel,
wherein the method comprises, prior to storing the time-domain waveform, generating sub-carriers by using the IFFT operation.

2. The method of claim 1 wherein each multicarrier modulated symbol includes a total of N sub-carriers that are available, and the set of sub-carriers include M consecutive sub-carriers that are in the middle of the N sub-carriers to be used, the M subcarriers are set between non-zeros and zeros alternately, where N>M.

3. The method of claim 2 wherein sub-carriers of each multicarrier modulated symbol are orthogonal sub-carriers.

4. The method of claim 3 where N=64 and M=13.

5. The method of claim 4 wherein 7 of the M subcarriers are set to non-zeros and the alternating remaining of the M subcarriers are set to zeros.

6. The method of claim 4 wherein the M consecutive sub-carriers has a duration of 3.2 microsecond (us).

7. The method of claim 2 wherein generating subcarriers by using the IFFT operation comprises generating the N sub-carriers by using the IFFT operation.

8. The method of claim 2 wherein the bandwidth (BW) of the M consecutive sub-carriers is 4.1 MHz.

9. The method of claim 1 wherein each multicarrier modulated symbol includes a guard interval prepended in time domain.

10. The method of claim 9 wherein the sub-carriers have an inter-carrier spacing (SS) of 312.5 kHz, and each multicarrier modulated symbol has a duration of 4 microsecond (us) including the guard interval.

11. The method of claim 1 wherein the sub-carriers are sampled at a sampling rate equal to 20 MHz.

12. The method of claim 1 wherein the waveform-coding comprises Manchester-coding the successive OOK mapped data bits onto successive retrieved copies of the time-domain waveforms of the multicarrier modulated symbols.

13. The method of claim 12 wherein each multicarrier modulated symbol has a duration of 4 us including a prepended guard interval duration of 0.8 us.

14. The method of claim 1 wherein:
storing, in the memory, the time-domain waveform of the multicarrier modulated symbol comprises storing a first time-domain version of the multicarrier modulated symbol having a leading 2 us duration having a higher energy level than a trailing 2 us duration, and a second time-domain version of the multicarrier modulated symbol having a leading 2 us duration having a lower energy level than a trailing 2 us duration, and
waveform-coding the successive on-off-keying (OOK) mapped data bits using retrieved copies of the time-domain waveform comprises retrieving a copy of the first time-domain version to represent one of a binary "1" data bit or a binary "0" data bit and retrieving a copy of the second time-domain version to represent the other of a binary "1" data bit or a binary "0" data bit.

15. A device for transmitting a data signal, comprising:
a memory storing instructions;
one or more processors coupled to the memory and configured to execute the instructions to:

in the memory, store a time-domain waveform of a multicarrier modulated symbol having a set of sub-carriers in which alternating sub-carriers are set to non-zeros and zeros in frequency domain;

waveform-code successive on-off-keying (OOK) mapped data bits using retrieved copies of the stored time-domain waveform to generate waveform coded multi-carrier modulated data symbols, wherein the time-domain waveform represents an output of an inverse fast Fourier transform (IFFT) operation; and up-convert the waveform coded multicarrier modulated data symbols to a carrier frequency to provide a data signal; and transmit the data signal over a wireless channel, wherein the one or more processors are configured to execute the instructions to: generate sub-carriers by using the IFFT operation prior to storing the time-domain waveform.

16. The device of claim 15 wherein each multicarrier modulated symbol includes a total of N sub-carriers that are available, and the set of sub-carriers includes M consecutive sub-carriers that are in the middle of N sub-carriers to be used, the M subcarriers are set between non-zero and zero alternately, where N>M.

17. The device of claim 16 where N=64 and M=13.

18. The device of claim 17 wherein 7 of the M subcarriers are set to non-zeros and the alternating remaining of the M subcarriers are set to zeros.

19. The device of claim 16 wherein
generating sub-carriers by using the IFFT operation comprises generating the N sub-carriers by using the IFFT operation.

20. The device of claim 15 wherein sub-carriers of each multicarrier modulated symbol are orthogonal sub-carriers.

* * * * *